(12) United States Patent
Sorenson et al.

(10) Patent No.: US 8,319,208 B2
(45) Date of Patent: Nov. 27, 2012

(54) METHODS OF FORMING THIN FILMS FOR MOLECULAR BASED DEVICES

(75) Inventors: Thomas A. Sorenson, Denver, CO (US); Brian Eastep, Colorado Springs, CO (US); Lee Gaherty, Colorado Springs, CO (US); Timothy L. Snow, Colorado Springs, CO (US)

(73) Assignee: ZettaCore IP, Inc., Menlo Park, CA (US)

( * ) Notice: Subject to any disclaimer, the term of this patent is extended or adjusted under 35 U.S.C. 154(b) by 391 days.

(21) Appl. No.: 12/572,192

(22) Filed: Oct. 1, 2009

(65) Prior Publication Data

US 2010/0085801 A1  Apr. 8, 2010

Related U.S. Application Data

(60) Provisional application No. 61/102,305, filed on Oct. 2, 2008.

(51) Int. Cl.
*H01L 35/24* (2006.01)

(52) U.S. Cl. .................................. 257/40; 257/E51.001

(58) Field of Classification Search ............ 257/40, 257/E51.001
See application file for complete search history.

(56) References Cited

U.S. PATENT DOCUMENTS

| | | | |
|---|---|---|---|
| 6,208,553 B1 | 3/2001 | Gryko et al. |
| 6,212,093 B1 | 4/2001 | Lindsey |
| 6,272,038 B1 | 8/2001 | Clausen et al. |
| 6,287,971 B1 | 9/2001 | Park et al. |
| 6,381,169 B1 | 4/2002 | Bocian et al. |
| 6,451,942 B1 | 9/2002 | Li et al. |
| 6,484,394 B1 | 11/2002 | Heo et al. |
| 6,614,048 B2 | 9/2003 | Leuschner |
| 6,642,376 B2 | 11/2003 | Lindsey et al. |
| 6,657,884 B2 | 12/2003 | Bocian et al. |
| 6,728,129 B2 | 4/2004 | Lindsey et al. |
| 6,777,516 B2 | 8/2004 | Li et al. |
| 6,855,950 B2 | 2/2005 | McCreery |
| 7,005,237 B2 | 2/2006 | Lindsey |
| 7,032,277 B2 | 4/2006 | Rolla et al. |
| 7,061,791 B2 | 6/2006 | Bocian et al. |
| 7,307,870 B2 | 12/2007 | Kuhr et al. |
| 7,324,385 B2 | 1/2008 | Mobley et al. |

(Continued)

FOREIGN PATENT DOCUMENTS

WO    WO 01/03126 A2    1/2001

OTHER PUBLICATIONS

Arnold, D., et al. "Mixed Phthalocyaninato-Porphyrinato Europium(III) Triple-decker Sandwich Complexes Containing a Conjugated Dimeric Porphyrin Ligand," Chemistry Letters (1999), pp. 483-484.

(Continued)

*Primary Examiner* — Anthony Ho
(74) *Attorney, Agent, or Firm* — Nixon Peabody LLP

(57) ABSTRACT

The invention generally encompasses methods of forming thin films molecular based devices, and devices formed therefrom. Some embodiments relate to molecular memory cells, molecular memory arrays, electronic devices including molecular memory, and processing systems and methods for producing molecular memories. More particularly, the present invention encompasses methods and molecular based devices comprising a wetting layer and redox-active molecules.

17 Claims, 8 Drawing Sheets

U.S. PATENT DOCUMENTS

| | | | |
|---|---|---|---|
| 7,332,599 | B2 | 2/2008 | Yu et al. |
| 7,348,206 | B2 | 3/2008 | Bocian et al. |
| 7,358,113 | B2 | 4/2008 | Shrivastava et al. |
| 2002/0094624 | A1 | 7/2002 | Ahn et al. |
| 2004/0004215 | A1* | 1/2004 | Iechi et al. ............... 257/40 |
| 2004/0217347 | A1* | 11/2004 | Tripsas et al. ............. 257/40 |
| 2004/0238816 | A1* | 12/2004 | Tano et al. ............... 257/40 |
| 2005/0243597 | A1 | 11/2005 | Gallo et al. |
| 2007/0098902 | A1 | 5/2007 | Engstrom et al. |
| 2007/0108438 | A1 | 5/2007 | Lindsey et al. |
| 2007/0123618 | A1 | 5/2007 | Bocian et al. |
| 2007/0258147 | A1 | 11/2007 | Van der Boom et al. |
| 2008/0119098 | A1 | 5/2008 | Palley et al. |
| 2008/0143906 | A1 | 6/2008 | Allemand et al. |
| 2008/0219041 | A1 | 9/2008 | Kuhr et al. |
| 2011/0114925 | A1* | 5/2011 | Hsu et al. ............... 257/40 |

OTHER PUBLICATIONS

Connelly, N., et al., "Chemical Redox Agents for Organometallic Chemistry," Chem. Rev. 1996, 96, pp. 877-910.

Connelly, N., et al., "The Electron-Transfer Reactions of Mononuclear Organotransition Metal Complexes," Advances in Organometallic Chemistry vol. 23, pp. 1-93.

Gassman, P., et al., "(Trifluoromethyl) Cyclopentadienide: A Powerful Electron-Withdrawing Ligand for Transition-Metal Complexes," J. Am. Chem. Soc. 108:1986, pp. 4228-4229.

Geiger, W., et al., "The Electron-Transfer Reactions of Polynuclear Organotransition Metal Complexes," Advances in Organometallic Chemistry vol. 24, pp. 87-130.

Jiang, J., et al., "Double-decker Yttrium (III) Complexes with Phthalocyaninato and Porphyrinato Ligands," J. Porphyrins Phthalocyanines, vol. 3, 1999, pp. 322-328.

Kil, D.S., et al., "Low-Temperature ALD Growth of SrTiO3 Thin Films from Sr B-Diketonates and Ti Alkoxide Precursors using Oxygen Remote Plasma as an Oxidation Source," Chemical Vapor Deposition, vol. 8, No. 5, Aug. 29, 2002, pp. 195-197.

Lee, B.H. et al., "Rapid Vapor-Phase Fabrication of Organic-Inorganic Hybrid Superlattices with Monolayer Precision," Journal of American Chemical Society, vol. 129, No. 51, Nov. 30, 2007, pp. 16034-16041.

Li, F., et al., "Effects of Central Metal Ion (Mg, Zn) and Solvent on Singlet Excited-State Energy Flow in Porphyrin-Based Nanoctructures," J. Mater Chem., vol. 7: 1997, pp. 1245-1262.

Ng, D., et al., "Sandwich-type Heteroleptic Phthalocyaninato and Porphyrinato Metal Complexes," (1997) Chem. Society Reviews vol. 26, pp. 433-442.

Robbins, J. L., et al., "Syntheses and Electronic Structures of Decamethylmetallocenes," J. Am. Chem. Soc., vol. 104, 1982, pp. 1882-1893.

Roth, K., et al., "Molecular Approach Toward Information Storage Based on the Redox Properties of Porphyrins in Self-Assembled Monolayers," J. Vacuum Society Technology B 18, 2000, pp. 2359-2364.

Roth, K., et al., "Measurements of Electron-Transfer Rates of Charge-Storage Molecular Monolayers on Si (100), Toward Hybrid Molecular/Semiconductor Information Storage Devices," J. Am. Chem. Soc. 125, 2003, pp. 505-517.

Seth, J., et al., "Soluble Synthetic Multiporphyrin Arrays. 3. Static Spectroscopic and Electrochemical Probes of Electronic Communication," J. Am. Chem. Soc., 118, 1996, pp. 11194-11207.

Seth, J., et al., "Investigation of Electronic Communication in Multi-Porphyrin Light-harvesting Arrays," J. Am. Chem. Soc., 116, 1994, pp. 10578-10592.

Shin, H., et al., "Formation of TiO2 and ZrO2 Nanotubes Using Atomic Layer Deposition with Ultraprecise Control of the Wall Thickness," Advanced Materials, vol. 16, No. 14, Jul. 19, 2004, pp. 1197-1200.

Strachan, et al., "Synthesis and Characterization of Tetrachlorodiarylethyne-Linked Porphyrin Dimers. Effects of Linker Architecture on Intradimer Electronic Communication," Inorg. Chem. 37, 1998, pp. 1191-1201.

Strachan, et al., "Effects of Orbital Ordering on Electronic Communication Multiporphyrin Arrays," J. Am. Chem. Soc., 119, 1997, pp. 11191-11201.

Yang, S., et al., "Ground and Excited State Electronic Properties of Halogenated Tetraarylporphyrins. Tuning the Building Blocks for Porphyrin-Based Photonic Devices," J. Porphyrins and Phthalocyanines, 3, 1999, pp. 117-147.

Yang, S., et al., "Interplay of Orbital Tuning and Linker Location in Controlling Electronic Communication in Porphyrin Arrays," J. Am. Chem. Soc., 121, 1999, pp. 4008-4018.

International Search Report and Written Opinion for PCT /US09/59345 mailed Dec. 4, 2009.

Lim, G., et al., Characteristics of TiO$\chi$ Films Prepared by Chemical Vapor Deposition Using Tetrakis-Dimethyl-Amido-Titanium and Water,: Thin Solid Films 498 (2006), pp. 254-258.

Maeng, W. J., et al., Thermal and Plasma-Enhanced ALD of Ta and Ti Oxide Thin Films from Alkylamide Precursors, Electrochemical and Solid-State Letters, 9 (6), (2006), pp. G191-G194.

van der Straten, et al., "Study of Copper-Refractory Metal Interfaces Via Solid-State Wetting for Emerging Nanoscale Interconnect Applications," J. Material Research vol. 21, No. 1, Jan. 2006, pp. 255-262.

van der Straten, et al., "Enhancement of Copper Wetting via Surfactant-Based Post-Treatment of Ultra-Thin Atomic Layer Deposited Tantalum Nitride Liners," Material Research Society Symp. Proc. vol. 766, 2003, pp. E10.3.1-E10.3.6.

\* cited by examiner

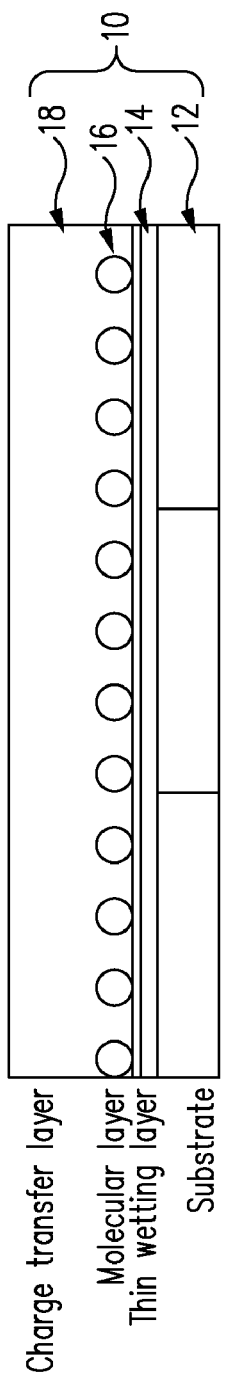
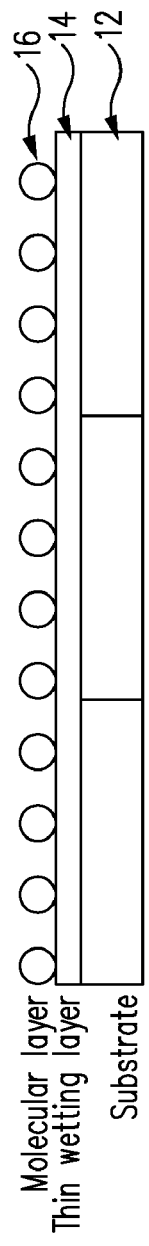
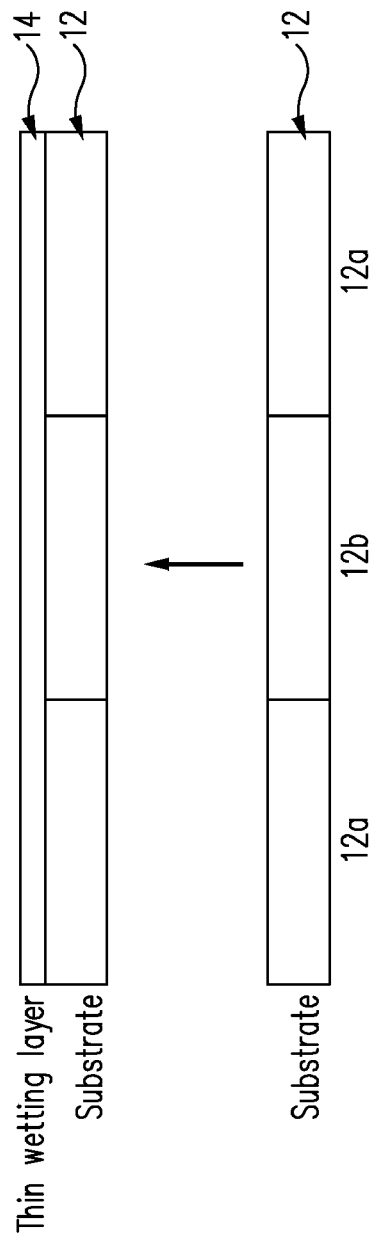
FIG. 1A
FIG. 1B
FIG. 1C
FIG. 1D

FIG. 2C Wetting Layer
Post Charge Transfer Layer Deposition

Post Counter Electrode Metallization

FIG. 2A No Wetting Layer

| Wafer ID | 2505-01-LL | 8340-04-LR | 8340-01-UL |
|---|---|---|---|
| Step 1 | 2cyc H2O + TDMATi | 5cyc H2O + TDMATi | 20cyc H2O + 1131 |
| Step 2 | 20cyc H2O + TDMATi + 1131 + 1145 | 20cyc H2O + 1131 | x |
| Freq @ 10% Loss | 10000 | 15000 | 2500 |
| Freq @ 50% Loss | 50000 | 80000 | 60000 |
| Freq @ 90% Loss | >MHz | 800000 | 500000 |

METHODS OF FORMING THIN FILMS FOR MOLECULAR BASED DEVICES

CROSS REFERENCE TO RELATED APPLICATIONS

This application claims the benefit of, and priority to, U.S. Provisional Patent Application Ser. No. 61/102,305 filed on Oct. 2, 2008, entitled "Methods of Forming Thin Films for Molecular Based Devices," the entire disclosure of which is incorporated herein by reference.

FIELD OF THE INVENTION

The invention broadly encompasses methods of forming thin films for molecular based devices, and devices formed therefrom. Some embodiments relate to molecular memory cells, molecular memory arrays, electronic devices including molecular memory, and processing systems and methods for producing molecular memories. More particularly, in some embodiments the present invention encompasses methods and molecular based devices comprising a wetting layer formed between a substrate and an active molecular layer.

BACKGROUND OF THE INVENTION

As device densities decrease, new developments in the design of semiconductor and other electronic devices receive continued focus. Advances in semiconductor processing and device design have resulted in computing devices being incorporated in a vast variety of machines, ranging from conventional programmable computers, and personal electronic equipment such as cell phones a PDAs to large scale communications systems, among others. There is an un-exhaustive demand for smaller, smarter devices that continue to offer more memory and functionality.

To meet such extensive demands, memory devices implement hundreds of megabits of storage in a single integrated circuit. These devices include volatile memory such as dynamic random access memory (DRAM) and static random access memory (SRAM), non-volatile memory such as electrically erasable programmable read only memory (EEPROM), flash RAM, ferroelectric DRAM), among others. Production of such memory devices continues to push the limits of processes and manufacturing equipment.

Performance of the memory components of a computing device is becoming an increasingly important determinant of overall system performance. Larger quantities of memory enable a greater variety of applications and functions to be implemented by the computing device and may reduce or eliminate the need for separate mass storage devices. Higher speed memory supports higher CPU processing frequencies, making the computing devices more useful for complex or real-time tasks. Denser memory devices support a growing variety of battery-powered electronic devices, such as laptop computers, PDAs, multifunction cellular telephones, and the like. At the same time, many of these applications benefit from reduced power consumption.

In many cases, improvements in semiconductor processing technology have led to the manufacture of denser, larger, faster and more power efficient memory devices. In many cases, the solid-state electronic behavior of the devices improves as the devices become smaller. Unfortunately, conventional memory, such as silicon-based DRAM memory, has reached a point where continued reduction in the size of conventional semiconductor memory cells is expected to adversely affect at least some of these important parameters.

One potential way to continue the development of ever faster, denser and more efficient devices is to develop molecular devices that implement some or all components of an electronic device or system with molecular scale structures and components. These molecular scale structures and components exhibit molecular rather than solid-state behavior. This can provide enhanced performance of the devices in many instances and permit further developments in device design. Molecules retain their essential properties down to the individual molecule level, and thus molecular-scale components and device structures can continue to be scaled down as future technologies and device designs develop.

It is advantageous for molecular device manufacturing techniques to be compatible with existing semiconductor industry processes, and to use existing semiconductor industry techniques and equipment were possible. However, molecular device processing is sensitive to many variables and conditions that are not problems in traditional semiconductor processing. Additionally, when devices are manufactured with molecular-scale features, problems are magnified and defects at the molecular scale become significant.

For example, in the fabrication of molecular memory devices, molecules are deposited onto a heterogeneous substrate having both conductive and non-conductive surfaces. Dissimilar surface tensions at these interfaces negatively impact the nucleation behavior of the molecules and the wetting behavior of a subsequently deposited charge transfer layer. This negatively impacts the ability to scale such structures. Further, such dissimilar nucleation and wetting behavior results in non-uniformities which degrade signal strength and speed performance, as well as negatively impact the reliability and reproducibility of the device. Thus, while developments have been made a continuing need exists for new developments in processing techniques and design of memory devices. Additionally, there is a need for continued advancements in molecular memory cells, molecular memory arrays, and electronic devices including molecular memory.

SUMMARY OF THE INVENTION

The invention broadly encompasses methods of forming thin films for molecular based devices, and devices formed. Some embodiments relate to molecular memory cells, molecular memory arrays, electronic devices including molecular memory, and processing systems and methods for producing molecular memories. More particularly, the present invention encompasses methods and molecular based devices comprising a wetting layer. In some embodiments, the molecular based device is a molecular storage device.

In some embodiments a molecular based device is provided, comprising a substrate, a wetting layer atop the substrate; a molecular layer atop the wetting layer; and a charge transfer layer atop the molecular layer.

In some embodiment a molecular based device is provided, characterized in that a wetting layer is disposed between a substrate and a molecular layer, the wetting layer comprised of a material that promotes nucleation of the molecular layer.

In another embodiment, a molecular based device is provided, characterized in that a wetting layer is disposed between a substrate and a molecular layer, the wetting layer comprised of a material that promotes equalization of surface tension across the substrate.

Optionally, the wetting layer may be comprised broadly of any material that enhances the performance of the molecular based device, such as the molecular charge and/or speed. In some embodiments, the wetting layer is comprised of a TiO$_2$ layer.

In another aspect of the invention, a molecular device is provided comprised of a substrate, a molecular layer atop the substrate wetting layer; and a charge transfer layer atop the molecular layer, wherein the molecular layer is comprised of molecules having functional groups configured to promote nucleation of the charge transfer layer atop the molecular layer. In some embodiments the functional groups are comprised of OH, NH$_3$, or OCH$_3$.

In another embodiment the invention encompasses a molecular memory element that includes a switching device, a bit line and a word line coupled to the switching device and a molecular storage device accessible through the switching device. The molecular storage device is capable of being placed in two or more discrete states, wherein the molecular storage device is placed in one of the discrete states by signals applied to the bit and word line. The molecular storage device comprises substrate, a wetting layer atop the substrate; a molecular layer atop the wetting layer; and a charge transfer layer atop the molecular layer.

Another embodiment encompasses molecular memory arrays comprising a plurality of molecular storage elements where each molecular storage element is capable of being placed in two or more discrete states. A plurality of bit lines and word lines are coupled to the plurality of molecular storage elements such that each molecular storage element is coupled to and addressable by at least one bit line and at least one word line.

In another aspect, methods of forming a molecular based device are provided. In one embodiment, a method of forming a molecular device on a substrate is provided, comprising the steps of forming a wetting layer atop the substrate; forming a molecular layer atop the wetting layer; and forming a charge transfer layer atop the molecular layer. In some embodiment, any one or more of the steps of forming are carried out by atomic layer deposition. In some embodiments, any one or more of the steps are carried out by chemical vapor deposition, plasma enhanced chemical vapor deposition, atomic layer deposition or physical vapor deposition.

BRIEF DESCRIPTION OF THE DRAWINGS

Other aspects, embodiments and advantages of the invention will become apparent upon reading of the detailed description of the invention and the appended claims provided below, and upon reference to the drawings in which:

FIGS. 1A-1D show cross-sectional schematic views of a molecular memory device illustrating sequential stages of forming the molecular based device according to one embodiment of the present invention;

FIGS. 2A-2D are micrographs showing improved wetting on devices formed according to embodiments of the present invention as compared to conventional devices;

DETAILED DESCRIPTION OF INVENTION

Overview

Figure 2D:
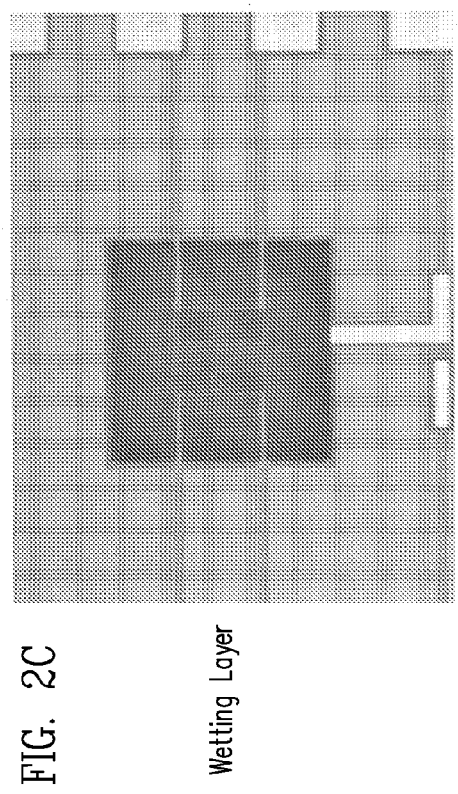
Figure 2D:
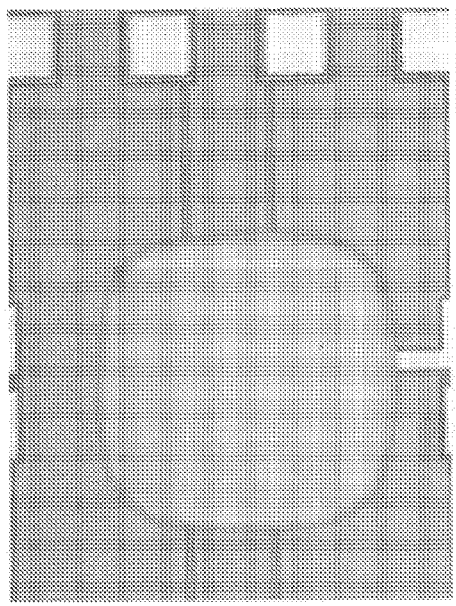
Figure 2B:
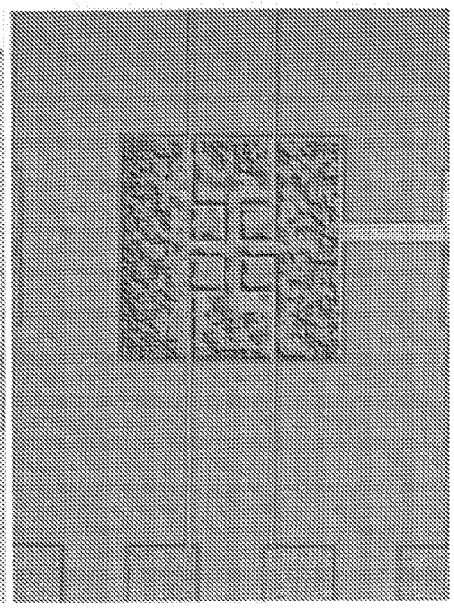
Figure 2B:
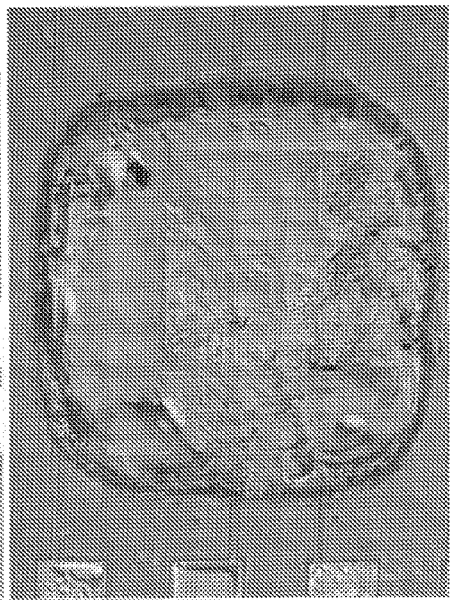

The invention generally encompasses methods of forming thin films for use in molecular based devices, and devices formed.

General Description

In some embodiments, methods of forming thin films molecular based devices, and devices formed therefrom, are provided. Some embodiments relate to molecular memory cells, molecular memory arrays, electronic devices including molecular memory, and processing systems and methods for producing molecular memories. Embodiments of the present invention encompass methods and molecular based devices comprising a wetting layer formed therein.

DEFINITIONS

As used herein and unless otherwise indicated, the term "acyl" refers to an organic acid group in which the OH of the carboxyl group is replaced by some other substituent (RCO—), such as described herein as "R" substitutent groups. Examples include, but are not limited to, halo, acetyl and benzoyl.

As used herein and unless otherwise indicated, the term "alkoxy group" means an —O—alkyl group, wherein alkyl is as defined herein. An alkoxy group can be unsubstituted or substituted with one or two suitable substituents. Preferably, the alkyl chain of an alkoxy group is from 1 to 6 carbon atoms in length, referred to herein, for example, as "(C1-C6) alkoxy."

As used herein and unless otherwise indicated, "alkyl" by itself or as part of another substituent, refers to a saturated or unsaturated, branched, straight-chain or cyclic monovalent hydrocarbon radical derived by the removal of one hydrogen atom from a single carbon atom of a parent alkane, alkene or alkyne. Also included within the definition of an alkyl group are cycloalkyl groups such as C5 and C6 rings, and hetero-cyclic rings with nitrogen, oxygen, sulfur or phosphorus (heterocycloalkyl). Alkyl also includes heteroalkyl, with heteroatoms of sulfur, oxygen, nitrogen, and silicon finding particular use in certain embodiments. Alkyl groups can be optionally substituted with R groups, independently selected at each position as described below.

Examples of alkyl groups include, but are not limited to, (C1-C6) alkyl groups, such as methyl, ethyl, propyl, isopropyl, 2-methyl-1-propyl, 2-methyl-2-propyl, 2-methyl-1-butyl, 3-methyl-1-butyl, 2-methyl-3-butyl, 2,2-dimethyl-1-propyl, 2-methyl-1-pentyl, 3-methyl-1-pentyl, 4-methyl-1-pentyl, 2-methyl-2-pentyl, 3-methyl-2-pentyl, 4-methyl-2-pentyl, 2,2-dimethyl-1-butyl, 3,3-dimethyl-1-butyl, 2-ethyl-1-butyl, butyl, isobutyl, t-butyl, pentyl, isopentyl, neopentyl, and hexyl, and longer alkyl groups, such as heptyl, and octyl.

The term "alkyl" is specifically intended to include groups having any degree or level of saturation, i.e., groups having exclusively carbon-carbon single bonds, groups having one or more carbon-carbon double bonds, groups having one or more carbon-carbon triple bonds and groups having mixtures of single, double and triple carbon-carbon bonds. Where a specific level of saturation is intended, the expressions "alkanyl," "alkenyl," and "alkynyl" are used.

"Alkanyl" by itself or as part of another substituent, refers to a saturated branched, straight-chain or cyclic alkyl radical derived by the removal of one hydrogen atom from a single carbon atom of a parent alkane. "Heteroalkanyl" is included as described above.

"Alkenyl" by itself or as part of another substituent, refers to an unsaturated branched, straight-chain or cyclic alkyl radical having at least one carbon-carbon double bond derived by the removal of one hydrogen atom from a single carbon atom of a parent alkene. The group may be in either the cis or trans conformation about the double bond(s). Suitable alkenyl groups include, but are not limited to (C2-C6) alkenyl groups, such as vinyl, allyl, butenyl, pentenyl, hexenyl, butadienyl, pentadienyl, hexadienyl, 2-ethylhexenyl, 2-propyl-2-butenyl, 4-(2-methyl-3-butene)-pentenyl. An alkenyl group can be unsubstituted or substituted with one or more independently selected R groups.

"Alkynyl" by itself or as part of another substituent, refers to an unsaturated branched, straight-chain or cyclic alkyl radical having at least one carbon-carbon triple bond derived by the removal of one hydrogen atom from a single carbon atom of a parent alkyne.

Also included within the definition of "alkyl" is "substituted alkyl". "Substituted" is usually designated herein as "R", and refers to a group in which one or more hydrogen atoms are independently replaced with the same or different substituent(s). R substituents can be independently selected from, but are not limited to, hydrogen, halogen, alkyl (including substituted alkyl (alkylthio, alkylamino, alkoxy, etc.), cycloalkyl, substituted cycloalkyl, cycloheteroalkyl, and substituted cycloheteroalkyl), aryl (including substituted aryl, heteroaryl or substituted heteroaryl), carbonyl, alcohol, amino, amido, nitro, ethers, esters, aldehydes, sulfonyl, sulfoxyl, carbamoyl, acyl, cyano, thiocyanato, silicon moieties, halogens, sulfur containing moieties, phosphorus containing moieties, etc. In some embodiments, as described herein, R substituents include redox active moieties (ReAMs). In some embodiments, optionally R and R' together with the atoms to which they are bonded form a cycloalkyl (including cycloheteroalkyl) and/or cycloaryl (including cycloheteroaryl), which can also be further substituted as desired. In the structures depicted herein, R is hydrogen when the position is unsubstituted. It should be noted that some compositions may allow two or three substitution groups, R and R', in which case the R and R' groups may be either the same or different.

In some embodiments, the R groups (subunits) are used to adjust the redox potential(s) of the subject compound. Thus, as is more fully described below and in references cited herein, an R group such as a redox active subunit can be added to a macrocycle, particularly a porphyrinic macrocycle to alter its redox potential. Certain preferred substituents include, but are not limited to, 4-chlorophenyl, 3-acetamidophenyl, 2,4-dichloro-4-trifluoromethyl, and ferrocene (including ferrocene derivatives). When the substituents are used for altering redox potentials, preferred substituents provide a redox potential range of less than about 5 volts, preferably less than about 2 volts, more preferably less than about 1 volt.

In certain embodiments, the R groups are as defined and depicted in the figures and the text from U.S. Pat. Ser. No. 60/687,464 which is incorporated herein by reference. A number of suitable proligands and complexes, as well as suitable substituents, are outlined in U.S. Pat. Nos. 6,212,093; 6,728,129; 6,451,942; 6,777,516; 6,381,169; 6,208,553; 6,657,884; 6,272,038; 6,484,394; and U.S. Pat. No. 7,348,206; Ser. No. 10/682,868; U.S. Pat. No. 7,005,237; Ser. No. 10/834,630; U.S. Pat. Nos. 6,642,376; 7,061,791; 7,332,599; 6,855,950; all of which are expressly incorporated by reference, in particular for the structures and descriptions thereof depicted therein, hereby expressly incorporated as substituent embodiments, both for the particular macrocycle the substituents are depicted within and for further substituted derivatives.

By "aryl" or grammatical equivalents herein is meant an aromatic monocyclic or polycyclic hydrocarbon moiety generally containing 5 to 14 carbon atoms (although larger polycyclic rings structures may be made) and any carbocyclic ketone or thioketone derivative thereof, wherein the carbon atom with the free valence is a member of an aromatic ring. Aromatic groups include arylene groups and aromatic groups with more than two atoms removed. For the purposes of this application aryl includes heteroaryl. "Heteroaryl" means an aromatic group wherein 1 to 5 of the indicated carbon atoms are replaced by a heteroatom chosen from nitrogen, oxygen, sulfur, phosphorus, boron and silicon wherein the atom with the free valence is a member of an aromatic ring, and any heterocyclic ketone and thioketone derivative thereof. Thus, heterocycle includes both single ring and multiple ring systems, e.g. thienyl, furyl, pyrrolyl, pyrimidinyl, indolyl, purinyl, quinolyl, isoquinolyl, thiazolyl, naphthalene, phenanthroline, etc. Also included within the definition of aryl is substituted aryl, with one or more substitution groups "R" as defined herein and outlined above and herein. For example, "perfluoroaryl" is included and refers to an aryl group where every hydrogen atom is replaced with a fluorine atom. Also included is oxalyl.

As used herein the term "halogen" refers to one of the electronegative elements of group VITA of the periodic table (fluorine, chlorine, bromine, iodine, astatine).

The term "nitro" refers to the $NO_2$ group.

By "amino groups" or grammatical equivalents herein is meant —$NH_2$, —NHR and —NRR' groups, with R and R' independently being as defined herein.

As used herein the term "pyridyl" refers to an aryl group where one CH unit is replaced with a nitrogen atom.

As used herein the term "cyano" refers to the —CN group.

As used here the term "thiocyanato" refers to the —SCN group.

The term "sulfoxyl" refers to a group of composition RS(O)— where R is some substitution group as defined herein, including alkyl, (cycloalkyl, perfluoroalkyl, etc.), or aryl (e.g., perfluoroaryl group). Examples include, but are not limited to methylsulfoxyl, phenylsulfoxyl, etc.

The term "sulfonyl" refers to a group of composition $RSO_2$- where R is a substituent group, as defined herein, with alkyl, aryl, (including cycloalkyl, perfluoroalkyl, or perfluoroaryl groups). Examples include, but are not limited to methylsulfonyl, phenylsulfonyl, p-toluenesulfonyl, etc.

The term "carbamoyl" refers to the group of composition R(R')NC(O)— where R and R' are as defined herein, examples include, but are not limited to N-ethylcarbamoyl, N,N-dimethylcarbamoyl, etc.

The term "amido" refers to the group of composition $R^1CON(R^2)$- where $R^1$ and $R^2$ are substituents as defined herein. Examples include, but are not limited to acetamido, N-ethylbenzamido, etc.

The term "acyl" refers to an organic acid group in which the OH of the carboxyl group is replaced by some other substituent (RCO—). Examples include, but are not limited to acetyl, benzoyl, etc.

In certain embodiments, when a metal is designated, e.g., by "M" or "Mn", where n is an integer, it is recognized that the metal can be associated with a counterion.

As used herein and unless otherwise indicated, the term "amperometric device" is a device capable of measuring the current produced in an electrochemical cell as a result of the application of a specific field potential ("voltage").

As used herein and unless otherwise indicated, the term "aryloxy group" means an —O— aryl group, wherein aryl is as defined herein. An aryloxy group can be unsubstituted or substituted with one or two suitable substituents. Preferably, the aryl ring of an aryloxy group is a monocyclic ring, wherein the ring comprises 6 carbon atoms, referred to herein as "(C6)aryloxy."

As used herein and unless otherwise indicated, the term "benzyl" means —CH2-phenyl.

As used herein and unless otherwise indicated, the term "carbonyl" group is a divalent group of the formula —C(O)—.

As used herein and unless otherwise indicated, the term "coulometric device" is a device capable of measuring the net charge produced during the application of a potential field ("voltage") to an electrochemical cell.

As used herein and unless otherwise indicated, the term "cyano" refers to the —CN group.

As used herein and unless otherwise indicated, the term "different and distinguishable" when referring to two or more oxidation states means that the net charge on the entity (atom, molecule, aggregate, subunit, etc.) can exist in two different states. The states are said to be "distinguishable" when the difference between the states is greater than thermal energy at room temperature (e.g., 0° C. to about 40° C.).

As used herein and unless otherwise indicated, the term "$E_{1/2}$" refers to the practical definition of the formal potential ($B_o$) of a redox process as defined by $B-B_o+(RT/nF)\ln(D_{ox}/D_{red})$ where R is the gas constant, T is temperature in K (Kelvin), n is the number of electrons involved in the process, F is the Faraday constant (96,485 Coulomb/mole), $D_{ox}$ is the diffusion coefficient of the oxidized species and $D_{red}$ is the diffusion coefficient of the reduced species.

As used herein and unless otherwise indicated, the term "electrically coupled" when used with reference to a storage molecule and/or storage medium and electrode refers to an association between that storage medium or molecule and the electrode such that electrons move from the storage medium/molecule to the electrode or from the electrode to the storage medium/molecule and thereby alter the oxidation state of the storage medium/molecule. Electrical coupling can include direct covalent linkage between the storage medium/molecule and the electrode, indirect covalent coupling (e.g. via a linker), direct or indirect ionic bonding between the storage medium/molecule and the electrode, or other bonding (e.g. hydrophobic bonding). In addition, no actual bonding may be required and the storage medium/molecule may simply be contacted with the electrode surface. There also need not necessarily be any contact between the electrode and the storage medium/molecule where the electrode is sufficiently close to the storage medium/molecule to permit electron tunneling between the medium/molecule and the electrode.

As used herein and unless otherwise indicated, the term "electrochemical cell" consists minimally of a reference electrode, a working electrode, a redox-active medium (e.g. a storage medium), and, if necessary, some means (e.g., a dielectric) for providing ionic conductivity between the electrodes and/or between the electrodes and the medium. In some embodiments, the dielectric is a component of the storage medium.

As used herein and unless otherwise indicated, the term "electrode" refers to any medium capable of transporting charge (e.g., electrons) to and/or from a storage molecule. Preferred electrodes are metals or conductive organic molecules. The electrodes can be manufactured to virtually any 2-dimensional or 3-dimensional shape (e.g., discrete lines, pads, planes, spheres, cylinders, etc.).

As used herein and unless otherwise indicated, the term "fixed electrode" is intended to reflect the fact that the electrode is essentially stable and unmovable with respect to the storage medium. That is, the electrode and storage medium are arranged in an essentially fixed geometric relationship with each other. It is of course recognized that the relationship alters somewhat due to expansion and contraction of the medium with thermal changes or due to changes in conformation of the molecules comprising the electrode and/or the storage medium. Nevertheless, the overall spatial arrangement remains essentially invariant. In a preferred embodiment this term is intended to exclude systems in which the electrode is a movable "probe" (e.g., a writing or recording "head," an atomic force microscope (AFM) tip, a scanning tunneling microscope (STM) tip, etc.).

As used herein and unless otherwise indicated, the term "linker" is a molecule used to couple two different molecules, two subunits of a molecule, or a molecule to a substrate.

As used herein and unless otherwise indicated, a metal is designated by "M" or "$M_n$," where n is an integer, it is recognized that the metal may be associated with a counter ion.

Many of the compounds described herein utilize substituents, generally depicted herein as "R." Suitable R groups include, but are not limited to, hydrogen, alkyl, alcohol, aryl, amino, amido, nitro, ethers, esters, aldehydes, sulfonyl, silicon moieties, halogens, cyano, acyl, sulfur containing moieties, phosphorus containing moieties, amido, imido, carbamoyl, linkers, attachment moieties, ReAMs and other subunits. It should be noted that some positions may allow two substitution groups, R and R', in which case the R and R' groups may be either the same or different, and it is generally preferred that one of the substitution groups be hydrogen. In some embodiments, the R groups are as defined and depicted in the figures and the text from a number of suitable proligands and complexes, as well as suitable substituents, as outlined in U.S. Pat. Nos. 6,212,093; 6,728,129; 6,451,942; 6,777,516; 6,381,169; 6,208,553; 6,657,884; 6,272,038; 6,484,394; and U.S. Pat. No. 7,348,206; Ser. No. 10/682,868; U.S. Pat. No. 7,005,237; Ser. No. 10/834,630; U.S. Pat. Nos. 6,642,376; 7,061,791; 7,332,599; 6,855,950; all of which are expressly incorporated by reference, in particular for the structures and descriptions thereof depicted therein, hereby expressly incorporated as substitutent embodiments, both for the particular macrocycle the substituents are depicted within and for further substituted derivatives.

As used herein and unless otherwise indicated, the term "sulfoxyl" refers to a group of composition RS(O)— where R is some alkyl, aryl, cycloalkyl, perfluoroalkyl, or perfluoroaryl group. Examples include, but are not limited to methylsulfoxyl, phenylsulfoxyl, etc.

As used herein and unless otherwise indicated, the term "sulfonyl" refers to a group of composition $RSO_2$, where R is some alkyl, aryl, cycloalkyl, perfluoroalkyl, or perfluoroaryl group. Examples include, but are not limited to methylsulfonyl, phenylsulfonyl, p-toluenesulfonyl, etc.

As used herein and unless otherwise indicated, the term "subunit" refers to a redox-active component of a molecule.

As used herein and unless otherwise indicated, the term "thiocyanato" refers to the —SCN group.

Molecular Based Devices and Methods of the Invention

Embodiments of the molecular based devices and methods of forming are now described in detail. Referring to FIGS. 1A-1D (particularly FIG. 1D) an exemplary embodiment of a molecular based device 10 of the present invention is shown as generally comprised of substrate 12, wetting layer 14 atop the substrate 12, molecular layer 16 atop the wetting layer 14, and charge transfer layer 18 atop the molecular layer 16.

The substrate 12 may be comprised of any desired material, such as glass, plastic, silicon, GaAs, and the like. In the exemplary embodiment the substrate 12 is comprised of a silicon wafer having conductive and non-conductive regions or surfaces. The conductive surfaces may be comprised of conductive materials such as but not limited to titanium, aluminum, copper, tungsten, TiN, TaN, and the like. The non-conductive surfaces may be comprised of dielectric materials such as but not limited to $SiO_2$, $Al_2O_3$, $HfO_2$, and the like. The substrate 12 typically, but not necessarily, comprises patterned structures formed therein.

The wetting layer 14 is disposed between the substrate 12 and the molecular layer 16. In some embodiments the wetting layer 14 is disposed directly between the substrate 12 and the molecular layer 16. In other embodiments, the wetting layer is not directly disposed between the substrate and molecular layers, and instead one or more other layers, such as a barrier layer, may be formed in between.

Of particular advantage, the inventors have discovered that the wetting layer 14 promotes improved nucleation of the molecular layer 16. Additionally in some embodiments, the wetting layer 14 can equalize the surface tension across substrate 12, thus enhancing the wetting properties during subsequent deposition of the charge transfer layer 18. The wetting layer 14 may be comprised broadly of any material that enhances or promotes the wetting and/or the nucleation of layers formed atop of, or subsequent to, the molecular layer 16, such as the charge transfer layer 18. Optionally, the wetting layer 14 may be comprised broadly of any material that enhances the performance of the molecular based device, such as the molecular charge and/or speed. Suitable materials for the wetting layer 14 include but are not limited to: titanium oxides, ruthenium oxides, tantalum oxides, aluminum oxides, hafnium oxide, or inorganic nitrides. In one preferred embodiment, the wetting layer 14 is comprised of $TiO_2$.

Molecular based devices of the present invention employ molecular layer 16, formed atop wetting layer 14. Generally, the molecular layer 16 is comprised of redox active molecules (ReAM). Redox active molecules suitable for use in the present invention are described in detail below.

In another embodiment, the molecular layer 16 is comprised of redox active molecules that include functional groups configured to promote and/or enhance the wetting behavior of the charge transfer layer 18. In this embodiment, the wetting layer 14 may still be present. Alternatively the wetting layer 14 may be omitted, since the functional groups of the redox active molecules provide the wetting function.

The charge transfer layer 18 may be comprised of any suitable material. In the exemplary embodiment, the charge transfer layer 18 is comprised of an electrolyte. In one example, the charge transfer layer 18 is comprised of a phosphonium based electrolyte, such as that described in detail in U.S. patent application Ser. No. 12/027,924; and U.S. Provisional Patent application Ser. No. 61/080,650, the disclosures of both of which are hereby incorporated by reference in their entirety. In one preferred embodiment, the charge transfer layer 18 is comprised of PHL21-TCM.

As mentioned above, the conductive and non-conductive regions or surfaces present challenges in formation of the molecular based devices. The two different surfaces have been found to exhibit very different wetting behavior. Of significant advantage, the inventors have discovered that deposition of the wetting layer across the substantial surface of the substrate 12 prior to deposition of the molecular layer results in significant and unexpected improvement in the device. FIG. 2A to 2D are micrographs showing improved wetting for devices formed with a wetting layer of $TiO_2$ formed below the molecular layer, verses devices formed with no wetting layer below the molecular layer. As shown, devices formed according to embodiments of the present invention exhibit significantly improved wetting to form substantially uniform films and devices. This improvement is realized at both the post charge transfer layer deposition stage, as well as after counter electrode metallization processing.

Figure 3:
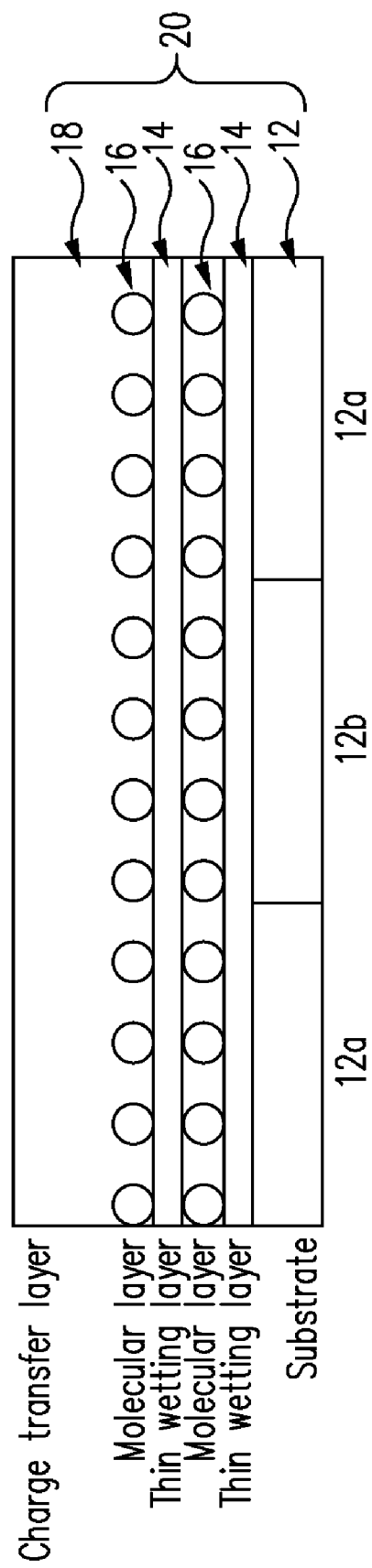
FIG. 3 is a cross-sectional schematic view of a multi-layered molecular memory device according to other embodiments of the present invention.

In some embodiments, a multiple or multi-layered molecular based device 20 is provided. In this embodiment one or more of the wetting layer 14 and/or molecular layer 16 are repeated atop the substrate as illustrated in FIG. 3. For example, multiple wetting layers 14 and multiple molecular layers 16 can be formed and layered repeatedly any desired number of times to achieve a desired property. Such desired properties include but are not limited to: desired charge, tuning the wetting behavior of the subsequent charge transfer layer 18, speed of the device, and the like.

The molecular based devices of the present invention may be formed by a variety of methods. Referring again to FIGS. 1A to 1D, an exemplary embodiment of the method is shown in sequential steps. First, in FIG. 1A, the substrate 12 is provided. In some embodiments, the substrate includes conductive 12a and non-conductive 12b surfaces or regions. As shown in FIG. 1B, a thin wetting layer 14 is formed or deposited atop the substantial to entire surface of the substrate 12. In one embodiment, the wetting layer 14 is comprised of $TiO_2$. The wetting layer 14 may comprised of any desired thickness. In some embodiments, the thickness of the wetting layer 14 is in the range of about 0.1 to 5.0 nm.

Next, molecular layer 16 is formed or deposited atop the wetting layer 14 as shown in FIG. 1C. In the exemplary embodiment, the molecular layer 16 is comprised of active redox molecules. The molecular layer 16 may comprised of any desired thickness. In some embodiments, the thickness of the molecular layer 16 is in the range of about 0.1 to 10.0 nm.

Subsequently, the charge transfer layer 18 is formed or deposited atop the molecular layer 16 as illustrated in FIG. 1D. In one embodiment, the charge transfer layer 18 is comprised of an electrolyte, such as but not limited to a phosphonium based electrolyte. In some embodiments, the thickness of the charge transfer layer 18 is in the range of about 2.0 to 100.0 nm.

Deposition of the layers may be accomplished by any suitable deposition method, such as by chemical vapor deposition (CVD), plasma enhanced CVD, atomic layer deposition (ALD), sputtering and the like. In one preferred embodiment, the wetting 14 and molecular 16 layers are deposited by ALD techniques as described below.

Atomic layer deposition (ALD) is generally carried out by sequential steps or "pulses" where a reactant precursor in gaseous or vapor form is injected into a process chamber and adsorbs on the surface of a substrate. The process chamber is then purged either by evacuation, inert gas purge, or both. Next, a separate pulse of another reactant precursor is conveyed to the process chamber and reacts with the adsorbed first precursor to form a monolayer of desired material on the surface of the substrate. The process chamber is then purged again, and this completes one ALD cycle. The cycle is then repeated until a layer of desired thickness is formed. ALD differs from traditional CVD in that the precursors are conveyed separately and sequentially, as opposed to the CVD process where the precursors are mixed together in the process chamber and reacted in the proximity of the substrate to deposit a layer on the substrate.

In one embodiment of the present invention, the wetting layer 14 is formed atop the substrate 12 by ALD. It should be understood that other deposition techniques may be used, and fall within the scope of the present invention, such as thermal vapor transfer (sublimation), CVD, physical vapor deposition (PVD), or any other deposition technique capable of depositing a substantially uniform film of desired thickness.

The substrate 12 is placed in a deposition chamber and heated to a temperature in the range of 85° C. to 400° C. Any suitable ALD deposition chamber may be used. In an exemplary embodiment, in the first step of the ALD sequence, $H_2O$ vapor is adsorbed to the surface by injecting or flowing a metered pulse over the surface of the substrate. The $H_2O$ vapor is flowed in an inert carrier gas at a flowrate in the range of 1 to 50 sccm, for a period of time in the range of $1\times10^{-5}$ to 10 seconds. This first step is carried out at a process pressure in the range of $1\times10^{-5}$ to 1.0 Torr. The $H_2O$ vapor is then purged from the deposition chamber. Other precursors such as methanol, ethanol, isopropanol, and the like can be used.

Next, a volatile titanium containing precursor is injected into the deposition chamber in another metered pulse and subsequently reacts with the adsorbed water to form a single layer of $TiO_2$ on the surface of the substrate. Any suitable titanium containing precursor may be used, such as but not limited to: tetrakis (dimethylamido) titanium (IV), Bis(diethylamino) bis(diisopropylamino) titanium(IV), Tetrakis (diethylamido) titanium(IV), Titanium(IV) chloride, Tetrakis (ethylmethylamido) titanium(IV) or similar. The titanium containing precursor is injected in an inert carrier gas at a flowrate in the range of 1 to 50 sccm, for a period of time in the range of $1\times10^{-5}$ to 10 seconds. This second step is carried out at a process pressure in the range of $1\times10^{-5}$ to 1.0 Torr. The titanium continuing precursor is then purged from the deposition chamber. This completes one ALD cycle. The process is then repeated in a cyclic manner until the desired thickness of the wetting layer is achieved. The thickness of the wetting layer can be controlled at the sub-nanometer level and can be tuned to achieve the desired performance criteria. The substrate 12 is now covered with a thin, substantially uniform wetting layer 14 onto which the molecular layer 16 and subsequent charge transfer layer 18 are deposited.

In an alternative embodiment, the wetting layer 14 is comprised of ruthenium or tantalum oxide. In this embodiment, a ruthenium or tantalum containing precursor, as the case may be, is injected into the deposition chamber in a metered pulse. Examples of suitable ruthenium and tantalum precursors include, but are not limited to: Bis(ethylcyclopentadienyl) ruthenium(II), Pentakis(dimethylamido)tantalum(V), Tris (diethylamido)(tert-butylimido) tantalum(V), and the like.

This invention addresses prior issues by depositing a very thin wetting layer, such as $TiO_2$ film, preferably of 0.1 to 0.5 nm, over the entire substrate prior to deposition of the redox molecule. Our application utilized atomic layer deposition (ALD) processes for both $TiO_2$ and redox molecules at temperatures ranging from 85° C. to 400° C. In addition to improving the nucleation behavior of the redox molecule (enhancing molecular performance), the $TiO_2$ equalizes the surface tension across the entire substrate enhancing the wetting properties during deposition of the subsequent charge transfer layer. This results in significant improvement in uniformity and device performance (i.e. molecular charge and speed). Our application utilizes a charge transfer layer comprised of phosphonium based electrolytes, however, tuning the surface tension of the underlying substrate would have similar benefits for deposition of any subsequent materials.

After deposition of the charge transfer layer an upper conductive material can be applied to complete the device (in the illustrative embodiment a capacitive storage cell), utilizing ALD, CVD, PVD or thermal evaporation.

Molecular Layer—Redox-Active Molecules

The molecular based devices of the present invention described herein can be employed to synthesize a wide range of hybrid components and/or devices, such as for example memory devices and elements. In an exemplary embodiment, devices formed herein are used to form molecular storage or memory devices having molecular layer 16 where information is stored in a redox-active information storage molecule.

The term "redox-active molecule (ReAM)" herein is meant to refer to a molecule or component of a molecule that is capable of being oxidized or reduced, e.g., by the application of a suitable voltage. As described below, ReAMs can include, but are not limited to macrocycles including porphyrin and porphyrin derivatives, ferrocene and ferrocene derivatives, as well as non-macrocyclic compounds, and includes sandwich compounds, e.g. as described herein. In certain embodiments, ReAMs can comprise multiple subunits, for example, in the case of dyads or triads. In general, as described below, there are several types of ReAMs useful in the present invention, all based on polydentate proligands, including macrocyclic and non-macrocyclic moieties. A number of suitable proligands and complexes, as well as suitable substituents, are outlined in U.S. Pat. Nos. 6,212,093; 6,728,129; 6,451,942; 6,777,516; 6,381,169; 6,208,553; 6,657,884; 6,272,038; 6,484,394; and U.S. Pat. No. 7,348, 206; Ser. No. 10/682,868; U.S. Pat. No. 7,005,237; Ser. No. 10/834,630; U.S. Pat. Nos. 6,642,376; 7,061,791; 7,332,599; 6,855,950; all of which are expressly incorporated by reference, in particular for the structures and descriptions thereof depicted therein.

Suitable proligands fall into two categories: ligands which use nitrogen, oxygen, sulfur, carbon or phosphorus atoms (depending on the metal ion) as the coordination atoms (generally referred to in the literature as sigma ($\sigma$) donors) and organometallic ligands such as metallocene ligands (generally referred to in the literature as pi ($\pi$) donors, and depicted herein as Lm).

In addition, a single ReAM may have two or more redox active. For example, FIG. 13A of U.S. Publication No. 2007/ 0108438 shows two redox active subunits, a porphorin (shown in the absence of a metal), and ferrocense. Similarly, sandwich coordination compounds are considered a single ReAM. This is to be distinguished from the case where these ReAMs are polymerized as monomers. In addition, the metal ions/complexes of the invention may be associated with a counterion, not generally depicted herein.

Macrocyclic Ligands

In one embodiment, the ReAM is a macrocyclic ligand, which includes both macrocyclic proligands and macrocyclic complexes. By "macrocyclic proligand" herein is meant a cyclic compound which contain donor atoms (sometimes referred to herein as "coordination atoms") oriented so that they can bind to a metal ion and which are large enough to encircle the metal atom. In general, the donor atoms are heteroatoms including, but not limited to, nitrogen, oxygen and sulfur, with the former being especially preferred. However, as will be appreciated by those in the art, different metal ions bind preferentially to different heteroatoms, and thus the heteroatoms used can depend on the desired metal ion. In addition, in some embodiments, a single macrocycle can contain heteroatoms of different types.

A "macrocyclic complex" is a macrocyclic proligand with at least one metal ion; in some embodiments the macrocyclic complex comprises a single metal ion, although as described below, polynucleate complexes, including polynucleate macrocyclic complexes, are also contemplated.

A wide variety of macrocyclic ligands find use in the present invention, including those that are electronically conjugated and those that may not be; however, the macrocyclic ligands of the invention preferably have at least one, and preferably two or more oxidation states, with 4, 6 and 8 oxidation states being of particular significance.

A broad schematic of suitable macrocyclic ligands are shown and described in FIGS. 11 and 14 of U.S. Publication No. 2007/0108438, all of which is incorporated by reference herein in addition to FIGS. 11 and 14. In this embodiment, roughly based on porphyrins, a 16 member ring (when the —X— moiety contains a single atom, either carbon or a heteroatom), 17 membered rings (where one of the —X— moieties contains two skeletal atoms), 18 membered rings (where two of the —X— moieties contains two skeletal atoms), 19 membered rings (where three of the —X— moieties contains two skeletal atoms) or 20 membered rings (where all four of the —X— moieties contains two skeletal atoms), are all contemplated. Each —X— group is independently selected. The -Q- moiety, together with the skeletal —C— heteroatom —C (with either single or double bonds independently connecting the carbons and heteroatom) for 5 or 6 membered rings that are optionally substituted with 1 or 2 (in the case of 5 membered rings) or 1, 2, or 3 (in the case of 6 membered rings) with independently selected R2 groups. In some embodiments, the rings, bonds and substituents are chosen to result in the compound being electronically conjugated, and at a minimum to have at least two oxidation states.

In some embodiments, the macrocyclic ligands of the invention are selected from the group consisting of porphyrins (particularly porphyrin derivatives as defined below), and cyclen derivatives.

Porphyrins

A particularly preferred subset of macrocycles suitable in the invention are porphyrins, including porphyrin derivatives. Such derivatives include porphyrins with extra rings ortho-fused, or ortho-perfused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, (3- or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g. phthalocyanines, sub-phthalocyanines, and porphyrin isomers). Additional suitable porphyrin derivatives include, but are not limited to the chlorophyll group, including etiophyllin, pyrroporphyrin, rhodoporphyrin, phylloporphyrin, phylloerythrin, chlorophyll a and b, as well as the hemoglobin group, including deuteroporphyrin, deuterohemin, hemin, hematin, protoporphyrin, mesohemin, hematoporphyrin mesoporphyrin, coproporphyrin, uruporphyrin and turacin, and the series of tetraarylazadipyrromethines.

As is true for the compounds outlined herein, and as will be appreciated by those in the art, each unsaturated position, whether carbon or heteroatom, can include one or more substitution groups as defined herein, depending on the desired valency of the system.

In one preferred embodiment, the redox-active molecule may be a metallocene, which can be substituted at any appropriate position, using R groups independently selected herein. A metallocene which finds particular use in the invention includes ferrocene and its derivatives. In this embodiment, preferred substituents include, but are not limited to, 4-chlorophenyl, 3-acetamidophenyl, 2,4-dichloro-4-trifluoromethyl. Preferred substituents provide a redox potential range of less than about 2 volts.

It will be appreciated that the oxidation potentials of the members of the series can be routinely altered by changing the metal (M) or the substituents.

Another example of a redox-active molecule comprised of a porphyrin is shown in FIG. 12H of U.S. Publication No. 2007/0108438 where F is a redox-active subunit (such as ferrocense, a substituted ferrocene, a metalloporphyrin, or a metallochlorin, and the like), J1 is a linker, M is a metal (such as Zn, Mg, Cd, Hg, Cu, Ag, Au, Ni, Pd, Pt, Co, Rh, Ir, Mn, B, Al, Ga, Pb and Sn) S1 and S2 are independently selected from the group of aryl, phenyl, cyclalkyl, alkyl, halogen, alkoxy, alkylhio, perfluoroalkyl, perfluoroaryl, pyridyl, cyano, thiocyanato, nitro, amino, alkylamino, acyl, sulfoxyl, sulfonyl, imido, amido, and carbamoyl wherein said substituents provide a redox potential range of less than about 2 volts, K1, K2, K3 and K4 are independently selected from the group of N, O, S, Se, Te and CH; L is a linker, X is selected from the group of a substrate, a couple to a substrate, and a reactive site that can ionically couple to a substrate. In preferred embodiments, X or L-X may be an alcohol or a thiol. In some embodiments, L-X can be eliminated and replaced with a substituent independently selected from the same group as S1 or S2.

Control over the hole-storage and hole-hopping properties of the redox-active units of the redox-active molecules used in the memory devices of the present invention allows fine control over the architecture of the memory device.

Such control is exercised through synthetic design. The hole-storage properties depend on the oxidation potential of the redox-active units or subunits that are themselves or are that are used to assemble the storage media used in the devices of this invention. The hole-storage properties and redox potential can be tuned with precision by choice of base molecule(s), associated metals and peripheral substituents (Yang et al. (1999) J. Porphyrins Phthalocyanines, 3: 117-147), the disclosure of which is herein incorporated by this reference.

For example, in the case of porphyrins, Mg porphyrins are more easily oxidized than Zn porphyrins, and electron withdrawing or electron releasing aryl groups can modulate the oxidation properties in predictable ways. Hole-hopping occurs among isoenergetic porphyrins in a nanostructure and is mediated via the covalent linker joining the porphyrins (Seth et al. (1994) J. Am. Chem. Soc., 116: 10578-10592, Seth et al (1996) J. Am. Chem. Soc., 118: 11194-11207, Strachan et al. (1997) J. Am. Chem. Soc., 119: 11191-11201; Li et al. (1997) J. Mater. Chem., 7: 1245-1262, Strachan et al. (1998) Inorg. Chem., 37: 1191-1201, Yang et al. (1999) J. Am. Chem. Soc., 121: 4008-4018), the disclosures of which are herein specifically incorporated by this reference in their entirety.

The design of compounds with predicted redox potentials is well known to those of ordinary skill in the art. In general, the oxidation potentials of redox-active units or subunits are well known to those of skill in the art and can be looked up (see, e.g., Handbook of Electrochemistry of the Elements).

Moreover, in general, the effects of various substituents on the redox potentials of a molecule are generally additive. Thus, a theoretical oxidation potential can be readily predicted for any potential data storage molecule. The actual oxidation potential, particularly the oxidation potential of the information storage molecule(s) or the information storage medium can be measured according to standard methods. Typically the oxidation potential is predicted by comparison of the experimentally determined oxidation potential of a base molecule and that of a base molecule bearing one substituent in order to determine the shift in potential due to that particular substituent. The sum of such substituent-dependent potential shifts for the respective substituents then gives the predicted oxidation potential.

The suitability of particular redox-active molecules for use in the methods of this invention can readily be determined. The molecule(s) of interest are simply polymerized and coupled to a surface (e.g., a hydrogen passivated surface) according to the methods of this invention. Then sinusoidal voltammetry can be performed (e.g., as described herein or in U.S. Pat. Nos. 6,272,038; 6,212,093; and 6,208,553, PCT Publication WO 01/03126, or by (Roth et al. (2000) Vac. Sci. Technol. B 18:2359-2364; Roth et al. (2003) J. Am. Chem. Soc. 125:505-517) to evaluate 1) whether or not the molecule(s) coupled to the surface, 2) the degree of coverage (coupling); 3) whether or not the molecule(s) are degraded during the coupling procedure, and 4) the stability of the molecule(s) to multiple read/write operations.

In addition, included within the definition of "porphyrin" are porphyrin complexes, which comprise the porphyrin proligand and at least one metal ion. Suitable metals for the porphyrin compounds will depend on the heteroatoms used as coordination atoms, but in general are selected from transition metal ions. The term "transition metals" as used herein typically refers to the 38 elements in groups 3 through 12 of the periodic table. Typically transition metals are characterized by the fact that their valence electrons, or the electrons they use to combine with other elements, are present in more than one shell and consequently often exhibit several common oxidation states. In certain embodiments, the transition metals of this invention include, but are not limited to one or more of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, and/or oxides, and/or nitrides, and/or alloys, and/or mixtures thereof.

Other Macrocycles

There are a number of macrocycles based on cyclen derivatives. FIGS. 17 and 13C of U.S. Publication No. 2007/0108438 shows a number of macrocyclic proligands loosely based on cyclen/cyclam derivatives, which can include skeletal expansion by the inclusion of independently selected carbons or heteroatoms. In some embodiments, at least one R group is a redox active subunit, preferably electronically conjugated to the metal. In some embodiments, including when at least one R group is a redox active subunit, two or more neighboring R2 groups form cycle or an aryl group.

Furthermore, in some embodiments, macrocyclic complexes relying organometallic ligands are used. In addition to purely organic compounds for use as redox moieties, and various transition metal coordination complexes with δ-bonded organic ligand with donor atoms as heterocyclic or exocyclic substituents, there is available a wide variety of transition metal organometallic compounds with π-bonded organic ligands (see Advanced Inorganic Chemistry, 5th Ed., Cotton & Wilkinson, John Wiley & Sons, 1988, chapter 26; Organometallics, A Concise Introduction, Elschenbroich et al., 2nd Ed., 1992, VCH; and Comprehensive Organometallic Chemistry II, A Review of the Literature 1982-1994, Abel et al. Ed., Vol. 7, chapters 7, 8, 10 & 11, Pergamon Press, hereby expressly incorporated by reference). Such organometallic ligands include cyclic aromatic compounds such as the cyclopentadienide ion [C5H5(−1)] and various ring substituted and ring fused derivatives, such as the indenylide (−1) ion, that yield a class of bis(cyclopentadieyl)metal compounds, (i.e. the metallocenes); see for example Robins et al., J. Am. Chem. Soc. 104:1882-1893 (1982); and Gassman et al., J. Am. Chem. Soc. 108:4228-4229 (1986), incorporated by reference. Of these, ferrocene [(C5H5)2Fe] and its derivatives are prototypical examples which have been used in a wide variety of chemical (Connelly et al., Chem. Rev. 96:877-910 (1996), incorporated by reference) and electrochemical (Geiger et al., Advances in Organometallic Chemistry 23:1-93; and Geiger et al., Advances in Organometallic Chemistry 24:87, incorporated by reference) electron transfer or "redox" reactions. Metallocene derivatives of a variety of the first, second and third row transition metals are useful as redox moieties (and redox subunits). Other potentially suitable organometallic ligands include cyclic arenes such as benzene, to yield bis(arene)metal compounds and their ring substituted and ring fused derivatives, of which bis(benzene)chromium is a prototypical example. Other acyclic π-bonded ligands such as the allyl(−1) ion, or butadiene yield potentially suitable organometallic compounds, and all such ligands, in conjunction with other π-bonded and δ-bonded ligands constitute the general class of organometallic compounds in which there is a metal to carbon bond. Electrochemical studies of various dimers and oligomers of such compounds with bridging organic ligands, and additional non-bridging ligands, as well as with and without metal-metal bonds are all useful.

When one or more of the co-ligands is an organometallic ligand, the ligand is generally attached via one of the carbon atoms of the organometallic ligand, although attachment may be via other atoms for heterocyclic ligands. Preferred organometallic ligands include metallocene ligands, including substituted derivatives and the metalloceneophanes (see page 1174 of Cotton and Wilkenson, supra). For example, derivatives of metallocene ligands such as methylcyclopentadienyl, with multiple methyl groups being preferred, such as pentamethylcyclopentadienyl, can be used to increase the stability of the metallocene. In some embodiments, the metallocene is derivatized with one or more substituents as outlined herein, particularly to alter the redox potential of the subunit or moiety.

As described herein, any combination of ligands may be used. Preferred combinations include: a) all ligands are nitrogen donating ligands; b) all ligands are organometallic ligands.

Sandwich Coordination Complexes

In some embodiments, the ReAMs are sandwich coordination complexes. The terms "sandwich coordination compound" or "sandwich coordination complex" refer to a compound of the formula L-Mn-L, where each L is a heterocyclic ligand (as described below), each M is a metal, n is 2 or more, most preferably 2 or 3, and each metal is positioned between a pair of ligands and bonded to one or more hetero atom (and typically a plurality of hetero atoms, e.g., 2, 3, 4, 5) in each ligand (depending upon the oxidation state of the metal). Thus sandwich coordination compounds are not organometallic compounds such as ferrocene, in which the metal is bonded to carbon atoms. The ligands in the sandwich coordination compound are generally arranged in a stacked orientation (i.e., are generally cofacially oriented and axially aligned with one another, although they may or may not be rotated about that axis with respect to one another) (see, e.g., Ng and Jiang (1997) Chemical Society Reviews 26: 433-442) incorporated by reference. Sandwich coordination complexes include, but are not limited to "double-decker sandwich coordination compound" and "triple-decker sandwich coordination compounds". The synthesis and use of sandwich coordination compounds is described in detail in U.S. Pat. Nos. 6,212,093; 6,451,942; 6,777,516; and polymerization of these molecules is described in U.S. Publication No. 2007/0123618, all of which are included herein, particularly the individual substituent groups that find use in both sandwich complexes and the "single" macrocycle" complexes.

The term "double-decker sandwich coordination compound" refers to a sandwich coordination compound as described above where n is 2, thus having the formula L'-M'-LZ, wherein each of L1 and LZ may be the same or different (see, e.g., Jiang et al. (1999) J. Porphyrins Phthalocyanines 3: 322-328) and U.S. Pat. Nos. 6,212,093; 6,451,942; 6,777,516; and polymerization of these molecules is described in U.S. Publication No. 2007/0123618, hereby incorporated by reference in its entirety.

The term "triple-decker sandwich coordination compound" refers to a sandwich coordination compound as described above where n is 3, thus having the formula L1-M1 LZ-MZ-L3, wherein each of L1, LZ and L3 may be the same or different, and M1 and MZ may be the same or different (see, e.g., Arnold et al. (1999) Chemistry Letters 483-484), and U.S. Pat. Nos. 6,212,093; 6,451,942; 6,777,516; and polymerization of these molecules is described in U.S. Publication No. 2007/0123618, hereby incorporated by reference in their entirety.

In addition, polymers of these sandwich compounds are also of use; this includes "dyads" and "triads" as described in U.S. Pat. Nos. 6,212,093; 6,451,942; 6,777,516; and polymerization of these molecules is described in U.S. Publication No. 2007/0123618, all of which are incorporated by reference.

Non-Macrocyclic Proligands and Complexes

As a general rule, ReAMs comprising non-macrocyclic chelators are bound to metal ions to form non-macrocyclic chelate compounds, since the presence of the metal allows for multiple proligands to bind together to give multiple oxidation states.

In some embodiments, nitrogen donating proligands are used. Suitable nitrogen donating proligands are well known in the art and include, but are not limited to, NH2; NHR; NRR'; pyridine; pyrazine; isonicotinamide; imidazole; bipyridine and substituted derivatives of bipyridine; terpyridine and substituted derivatives; phenanthrolines, particularly 1,10-phenanthroline (abbreviated phen) and substituted derivatives of phenanthrolines such as 4,7-dimethylphenanthroline and dipyridol[3,2-a:2',3'-c]phenazine (abbreviated dppz); dipyridophenazine; 1,4,5,8,9,12-hexaazatriphenylene (abbreviated hat); 9,10-phenanthrenequinone diimine (abbreviated phi); 1,4,5,8-tetraazaphenanthrene (abbreviated tap); 1,4,8,11-tetra-azacyclotetradecane (abbreviated cyclam) and isocyanide. Substituted derivatives, including fused derivatives, may also be used. It should be noted that macrocylic ligands that do not coordinatively saturate the metal ion, and which require the addition of another proligand, are considered non-macrocyclic for this purpose. As will be appreciated by those in the art, it is possible to covalently attach a number of "non-macrocyclic" ligands to form a coordinatively saturated compound, but that is lacking a cyclic skeleton.

Suitable sigma donating ligands using carbon, oxygen, sulfur and phosphorus are known in the art. For example, suitable sigma carbon donors are found in Cotton and Wilkenson, Advanced Organic Chemistry, 5th Edition, John Wiley & Sons, 1988, hereby incorporated by reference; see page 38, for example. Similarly, suitable oxygen ligands include crown ethers, water and others known in the art. Phosphines and substituted phosphines are also suitable; see page 38 of Cotton and Wilkenson.

The oxygen, sulfur, phosphorus and nitrogen-donating ligands are attached in such a manner as to allow the heteroatoms to serve as coordination atoms.

Polynucleating Proligands and Complexes

In addition, some embodiments utilize polydentate ligands that are polynucleating ligands, e.g. they are capable of binding more than one metal ion. These may be macrocyclic or non-macrocyclic.

A number of suitable proligands and complexes, as well as suitable substituents, are outlined in U.S. Pat. Nos. 6,212,093; 6,728,129; 6,451,942; 6,777,516; 6,381,169; 6,208,553; 6,657,884; 6,272,038; 6,484,394; and U.S. Pat. No. 7,348, 206; Ser. No. 10/682,868; U.S. Pat. No. 7,005,237; Ser. No. 10/834,630; U.S. Pat. Nos. 6,642,376; 7,061,791; 7,332,599; 6,855,950; all of which are expressly incorporated by reference, in particular for the structures and descriptions thereof depicted therein.

Atomic Layer Deposition of the Redox Molecules

In another aspect of the present invention, methods of forming redox molecules on a molecular based semiconductor device are provided. More specifically, methods of depositing redox active molecules on a substrate by atomic layer deposition to form a molecular based semiconductor device are provided.

In one example, a method of depositing a molecular layer on a substrate in a deposition chamber is provided comprising the steps of: conveying $H_2O$ vapor to the deposition chamber to form a monolayer on the surface of the substrate; purging the deposition chamber; and conveying one or more redox-active molecules to the deposition chamber wherein the redox-active molecules react with the monolayer to form a molecular layer on the surface of the substrate. In some embodiments, the method is carried out at a temperature in the range of 85° C. to 400° C. The utilization of $H_2O$ vapor to form a monolayer of redox-active molecules on the substrate surface is molecule specific and is not required in all cases.

In the exemplary embodiment $H_2O$ vapor is flowed in an inert carrier gas at a flowrate in the range of 1 to 50 sccm, for a period of time in the range of $1 \times 10^{-5}$ to 10 seconds. This first step is carried out at a process pressure in the range of $1 \times 10^{-5}$ to 1 Torr. The $H_2O$ vapor is then purged from the deposition chamber. Next, one or more redox-active molecules are flowed into the deposition chamber in an inert carrier gas at a flowrate in the range of 1 to 50 sccm, for a period of time in the range of $1 \times 10^{-5}$ to 10 seconds. This second step is carried out at a process pressure in the range of $1 \times 10^{-5}$ to 1 Torr. The deposition chamber is then purged. Depending on the nucleation kinetics of the redox-active molecules to the substrate or wetting layer, a pause of 1 to 100 seconds may be preferred between injection of the redox-active molecule and the deposition chamber purge. The process can then be repeated in a cyclic manner until the desired property such as thin film thickness, charge, or similar is achieved.

Applications and Uses of the Molecular Based Devices

As used herein and unless otherwise indicated, the term "memory element," "memory cell," or "storage cell" refer to an electrochemical cell that can be used for the storage of information. Preferred "storage cells" are discrete regions of storage medium addressed by at least one and preferably by two electrodes (e.g., a working electrode and a reference electrode). The storage cells can be individually addressed (e.g., a unique electrode is associated with each memory element) or, particularly where the oxidation states of different memory elements are distinguishable, multiple memory elements can be addressed by a single electrode. The memory element can optionally include a dielectric (e.g., a dielectric impregnated with counter ions).

As used herein the term "electrode" refers to any medium capable of transporting charge (e.g., electrons) to and/or from a storage molecule. Preferred electrodes are metals and conductive organic molecules, including, but not limited to, Group III elements (including doped and oxidized Group III elements), Group IV elements (including doped and oxidized Group IV elements), Group V elements (including doped and oxidized Group V elements) and transition metals (including transition metal oxides and transition metal nitrides). The electrodes can be manufactured to virtually any 2-dimensional or 3-dimensional shape (e.g., discrete lines, pads, planes, spheres, cylinders).

As used herein and unless otherwise indicated, the term "multiple oxidation states" means more than one oxidation state. In preferred embodiments, the oxidation states may reflect the gain of electrons (reduction) or the loss of electrons (oxidation).

As used herein and unless otherwise indicated, the term "multiporphyrin array" refers to a discrete number of two or more covalently-linked porphyrinic macrocycles. The multiporphyrin arrays can be linear, cyclic, or branched.

As used herein and unless otherwise indicated, the term "output of an integrated circuit" refers to a voltage or signal produced by one or more integrated circuit(s) and/or one or more components of an integrated circuit.

As used herein and unless otherwise indicated, the term "present on a single plane," when used in reference to a memory device of this invention refers to the fact that the component(s) (e.g. storage medium, electrode(s), etc.) in question are present on the same physical plane in the device (e.g. are present on a single lamina). Components that are on the same plane can typically be fabricated at the same time, e.g., in a single operation. Thus, for example, all of the electrodes on a single plane can typically be applied in a single (e.g., sputtering) step (assuming they are all of the same material).

As used herein and unless otherwise indicated, a potentiometric device is a device capable of measuring potential across an interface that results from a difference in the equilibrium concentrations of redox molecules in an electrochemical cell.

As used herein and unless otherwise indicated, the term "oxidation" refers to the loss of one or more electrons in an element, compound, or chemical substituent/subunit. In an oxidation reaction, electrons are lost by atoms of the element(s) involved in the reaction. The charge on these atoms must then become more positive. The electrons are lost from the species undergoing oxidation and so electrons appear as products in an oxidation reaction. An oxidation taking place in the reaction $Fe^{2+}(aq) \rightarrow Fe^{3+}(aq) + e^-$ because electrons are lost from the species being oxidized, $Fe^{2+}(aq)$, despite the apparent production of electrons as "free" entities in oxidation reactions. Conversely the term reduction refers to the gain of one or more electrons by an element, compound, or chemical substituent/subunit.

As used herein and unless otherwise indicated, the term "oxidation state" refers to the electrically neutral state or to the state produced by the gain or loss of electrons to an element, compound, or chemical substituent/subunit. In a preferred embodiment, the term "oxidation state" refers to states including the neutral state and any state other than a neutral state caused by the gain or loss of electrons (reduction or oxidation).

As used herein and unless otherwise indicated, the term "read" or "interrogate" refer to the determination of the oxidation state(s) of one or more molecules (e.g. molecules comprising a storage medium).

As used herein and unless otherwise indicated, the term "redox-active unit" or "redox-active subunit" refers to a molecule or component of a molecule that is capable of being oxidized or reduced by the application of a suitable voltage.

As used herein and unless otherwise indicated, the term "refresh" when used in reference to a storage molecule or to a storage medium refers to the application of a voltage to the storage molecule or storage medium to re-set the oxidation state of that storage molecule or storage medium to a predetermined state (e.g., the oxidation state the storage molecule or storage medium was in immediately prior to a read).

As used herein and unless otherwise indicated, the term "reference electrode" is used to refer to one or more electrodes that provide a reference (e.g., a particular reference voltage) for measurements recorded from the working electrode. In preferred embodiments, the reference electrodes in a memory device of this invention are at the same potential although in some embodiments this need not be the case.

As used herein and unless otherwise indicated, a "sinusoidal voltammeter" is a voltammetric device capable of determining the frequency domain properties of an electrochemical cell.

As used herein and unless otherwise indicated, the term "storage density" refers to the number of bits per volume and/or bits per molecule that can be stored. When the storage medium is said to have a storage density greater than one bit per molecule, this refers to the fact that a storage medium preferably comprises molecules wherein a single molecule is capable of storing at least one bit of information.

As used herein and unless otherwise indicated, the term "storage location" refers to a discrete domain or area in which a storage medium is disposed. When addressed with one or more electrodes, the storage location may form a storage cell. However if two storage locations contain the same storage media so that they have essentially the same oxidation states, and both storage locations are commonly addressed, they may form one functional storage cell.

As used herein and unless otherwise indicated, the term "storage medium" refers to a composition comprising a molecular based device of the invention.

A substrate is a, preferably solid, material suitable for the attachment of one or more molecules. Substrates can be formed of materials including, but not limited to glass, plastic, silicon, minerals (e.g., quartz), semiconducting materials, ceramics, metals, etc.

As used herein and unless otherwise indicated, the term "voltammetric device" is a device capable of measuring the current produced in an electrochemical cell as a result of the application of a voltage or change in voltage.

As used herein and unless otherwise indicated, a voltage source is any source (e.g. molecule, device, circuit, etc.) capable of applying a voltage to a target (e.g., an electrode).

As used herein and unless otherwise indicated, the term "working electrode" is used to refer to one or more electrodes that are used to set or read the state of a storage medium and/or storage molecule.

Molecular Based Devices

In some embodiments a molecular storage device is provided, comprising a substrate, a wetting layer atop the substrate; a molecular layer atop the wetting layer; and a charge transfer layer atop the molecular layer.

In another embodiment the invention encompasses a molecular memory element that includes a switching device, a bit line and a word line coupled to the switching device and a molecular storage device accessible through the switching device. The molecular storage device is capable of being placed in two or more discrete states, wherein the molecular storage device is placed in one of the discrete states by signals applied to the bit and word line. The molecular storage device comprises a substrate, a wetting layer atop the substrate; a molecular layer atop the wetting layer; and a charge transfer layer atop the molecular layer. Another embodiment encompasses molecular memory arrays comprising a plurality of molecular storage elements where each molecular storage element is capable of being placed in two or more discrete states. A plurality of bit lines and word lines are coupled to the plurality of molecular storage elements such that each molecular storage element is coupled to and addressable by at least one bit line and at least one word line.

The molecular memory device may include an addressable array of molecular storage elements. An address decoder receives a coded address and generates word line signals corresponding to the coded address. A word line driver is coupled to the address decoder and produces amplified word line signals. The amplified word line signals control switches that selectively couple members of the array of molecular storage elements to bit lines. Read/write logic coupled to the bit lines determines whether the molecular memory device is in a read mode or a write mode. In a read mode, sense amplifiers coupled to each bit line detect an electronic state of the selectively coupled molecular storage elements and produce a data signal on the bit line indicative of the electronic state of the selectively coupled molecular storage elements. In a write mode, the read/write logic drives a data signal onto the bit lines and the selectively coupled molecular storage elements.

Another embodiment encompasses devices including logic integrated with embedded molecular memory devices such as application specific integrated circuit (ASIC) and system on chip (SOC) devices and the like. Such implementations comprise one or more functional components formed monolithically with and interconnected to molecular memory devices. The functional components may comprise solid state electronic devices and/or molecular electronic devices.

In particular embodiments, the molecular storage device is implemented as a stacked structured formed subsequent to and above a semiconductor substrate having active devices formed therein. In other embodiments, the molecular storage device is implemented as a micron or nanometer sized hole in a semiconductor substrate have active devices formed therein. The molecular storage device is fabricated using processing techniques that are compatible with the semiconductor substrate and previously formed active devices in the semiconductor substrate.

Other embodiments of the invention include the use of components independently selected from transistor switching devices including field effect transistor; a row decoder coupled to the word line; a column decoder coupled to the bit line; a current preamplifier connected to the bit line; a sense amplifier connected to the bit line, an address decoder that receives a coded address and generates word line signals corresponding to the coded address, a line driver coupled to the address decoder wherein the line driver produces amplified word line signals (optionally wherein the amplified word line signals control switches that selectively couple members of the array of molecular storage elements to bit lines), read/write logic coupled to the bit lines, wherein the read/write logic determines whether the molecular memory devices is in a read mode or a write mode, sense amplifiers coupled to each bit line, wherein when the device is in a read mode, sense amplifiers coupled to each bit line detect an electronic state of the selectively coupled molecular storage elements and produce a data signal on the bit line indicative of the electronic state of the selectively coupled molecular storage elements (such that when the device is in a write mode, the read/write logic drives a data signal onto the bit lines and the selectively coupled molecular storage elements) electrolyte layers; and combinations thereof.

Additional embodiments have the memory arrays of the invention comprising volatile memory such as DRAM or SRAM, or non-volatile memory such as Flash or ferroelectric memory.

Another embodiment encompasses a monolithically integrated device comprising logic devices configured to perform a particular function and embedded molecular memory devices of the invention coupled to the logic devices. The device may optionally comprise an application specific integrated circuit (ASIC), a system on chip (SOC), a solid state electronic devices or molecular electronic devices.

In some embodiments the memory devices of this invention can be fabricated using standard methods well known to those of skill in the art. In a preferred embodiment, the electrode layer(s) are applied to a suitable substrate (e.g., silica, glass, plastic, ceramic, etc.) according to standard well known methods (see, e.g., Rai-Choudhury (1997) The Handbook of Microlithography, Micromachining, and Microfabrication, SPIE Optical Engineering Press; Bard & Faulkner (1997) Fundamentals of Microfabrication). A variety of techniques are described below and also in U.S. Pat. Nos. 6,212,093; 6,728,129; 6,451,942; 6,777,516; 6,381,169; 6,208,553; 6,657,884; 6,272,038; 6,484,394; and U.S. Pat. No. 7,348,206; Ser. No. 10/682,868; U.S. Pat. No. 7,005,237; Ser. No. 10/834,630; U.S. Pat. Nos. 6,642,376; 7,061,791; 7,332,599; 6,855,950; and U.S. Publication No. 2007/0123618, all of which are expressly incorporated by reference, in particular for the fabrication techniques outlined therein.

There are a wide variety of device and systems architectures that benefit from the use of molecular memory.

Memory devices are operated by receiving a N-bit row address into row address decoder and a M-bit column address into column address decoder. The row address decoder generates a signal on one word line. Word lines may include word line driver circuitry that drives a high current signal onto word lines. Because word lines tend to be long, thin conductors that stretch across much of the chip surface, it requires significant current and large power switches to drive a word lines signal. As a result, line driver circuits are often provided with power supply in addition to power supply circuits (not shown) that provide operating power for the other logic. Word line drivers, therefore, tend to involve large components and the high speed switching of large currents tends to create noise, stress the limits of power supplies and power regulators, and stress isolation structures.

In a conventional memory array there are more columns (bit lines) than rows (word lines) because during refresh operations, each word line is activated to refresh all of storage elements coupled to that word line. Accordingly, the fewer the number of rows, the less time it takes to refresh all of the rows. One feature of the present invention is that the molecular memory elements can be configured to exhibit significantly longer data retention than typical capacitors, in the order of tens, hundreds, thousands or effectively, unlimited seconds. Hence, the refresh cycle can be performed orders of magnitude less frequently or omitted altogether. Accordingly, refresh considerations that actually affect the physical layout of a memory array can be relaxed and arrays of various geometry can be implemented. For example, memory array can readily be manufactured with a larger number of word lines, which will make each word line shorter. As a result, word line driver circuits can be made smaller or eliminated because less current is required to drive each word line at a high speed. Alternatively or in addition, shorter word lines can be driven faster to improve read/write access times. As yet another alternative, each row of memory locations can be provided with multiple word lines to provide a mechanism for storing multiple states of information in each memory location Sense amplifiers are coupled to each bit line and operate to detect signals on bit lines 109 that indicate the state of a memory element coupled to that bit line, and amplify that state to an appropriate logic level signal. In one embodiment, sense amplifiers may be implemented with substantially conventional designs as such conventional designs will operate to detect and amplify signals from a molecular memory element. Alternatively, unlike conventional capacitors, some molecular storage elements provide very distinct signals indicating their state. These distinct signals may reduce the need for conventional sense amplifier logic as the state signal from a molecular storage device can be more readily and reliably latched into buffers of read/write logic than can signals stored in conventional capacitors. That is, the present invention can provide devices which are sufficiently large as to obviate the need for a sense amplifier.

Read/write logic includes circuitry for placing the memory device in a read or write state. In a read state, data from molecular array is placed on bit lines (with or without the operation of sense amplifiers), and captured by buffers/latches in read/write logic. Column address decoder will select which bit lines are active in a particular read operation. In a write operation, read/write logic drives data signals onto the selected bit lines such that when a word line is activated, that data overwrites any data already stored in the addressed memory element(s).

A refresh operation is substantially similar to a read operation; however, the word lines are driven by refresh circuitry (not shown) rather than by externally applied addresses. In a refresh operation, sense amplifiers, if used, drive the bit lines to signal levels indicating the current state of the memory elements and that value is automatically written back to the memory elements. Unlike a read operation, the state of bit lines is not coupled to read/write logic during a refresh. This operation is only required if the charge retention time of the molecules used is less than the operational life of the device used, for example, on the order of 10 years for Flash memory.

In an exemplary embedded system that comprises a central processing unit and molecular memory, a memory bus couples a CPU and molecular memory device to exchange address, data, and control signals. Optionally, embedded system may also contain conventional memory coupled to memory bus. Conventional memory may include random access memory (e.g., DRAM, SRAM, SDRAM and the like), or read only memory (e.g., ROM, EPROM, EEPROM and the like). These other types of memory may be useful for caching data molecular memory device, storing operating system or BIOS files, and the like. Embedded system may include one or more input/output (I/O) interfaces that enable CPU to communicate with external devices and systems. I/O interface may be implemented by serial ports, parallel ports, radio frequency ports, optical ports, infrared ports and the like. Further, interface may be configured to communicate using any available protocol including packet-based protocols.

EXAMPLES

Embodiments of the present invention are now described in further detail with reference to specific Examples. The Examples provided below are intended for illustration purposes only and in no way limit the scope and/or teaching of the invention.

Example 1

Figure 4A:
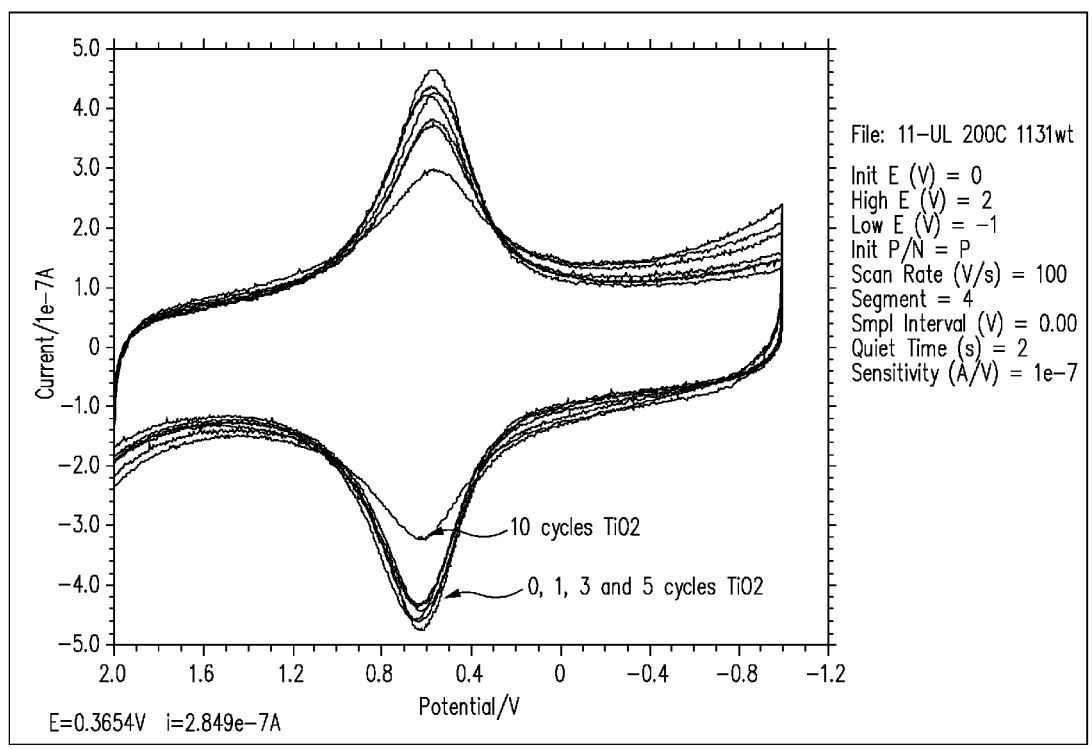
FIGS. 4A and 4B depict current and potential curves illustrating the performance of a molecular memory device according to one embodiment of the present invention.
Figure 4B:
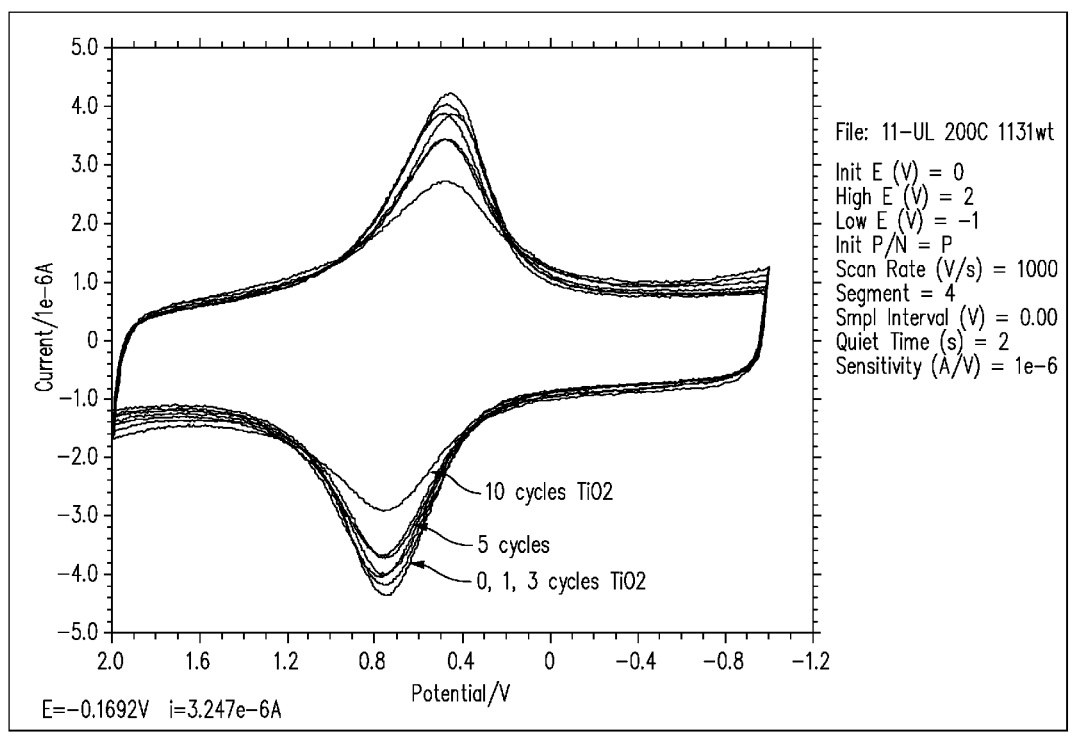

In general, molecular based devices were formed as described above, and utilizing a wetting layer comprised of $TiO_2$. In this example the wetting layer of $TiO_2$ was formed atop of the molecular layer. In the exemplary embodiment, the $TiO_2$ layer was formed after deposition of the redox-active molecular layer. $H_2O$ vapor is flowed in an inert carrier gas at a flowrate in the range of 1 to 50 sccm, for a period of time in the range of $1\times10^{-5}$ to 10 seconds. This first step is carried out at a process pressure in the range of $1\times10^{-5}$ to 1 Torr. The $H_2O$ vapor is then purged from the deposition chamber. Next, tetrakis(dimethylamido) Ti(IV) is flowed into the deposition chamber in an inert carrier gas at a flowrate in the range of 1 to 50 sccm, for a period of time in the range of $1\times10^{-5}$ to 10 seconds. This second step is carried out at a process pressure in the range of $1\times10^{-5}$ to 1 Torr. The deposition chamber is then purged. FIGS. 4A and 4B depict current and potential curves illustrating the performance of a molecular memory devices formed in this Example 1. As shown, the amount of charge observed by integrating the peak decreases with number of ALD cycles deposited atop the molecular layer. The speed of the device, as determined by the difference in potential observed between the oxidation peak and the reduction peak, was not impacted by the number of ALD cycles of $TiO_2$ that were deposited atop the molecular layer.

Example 2

Figure 5A:
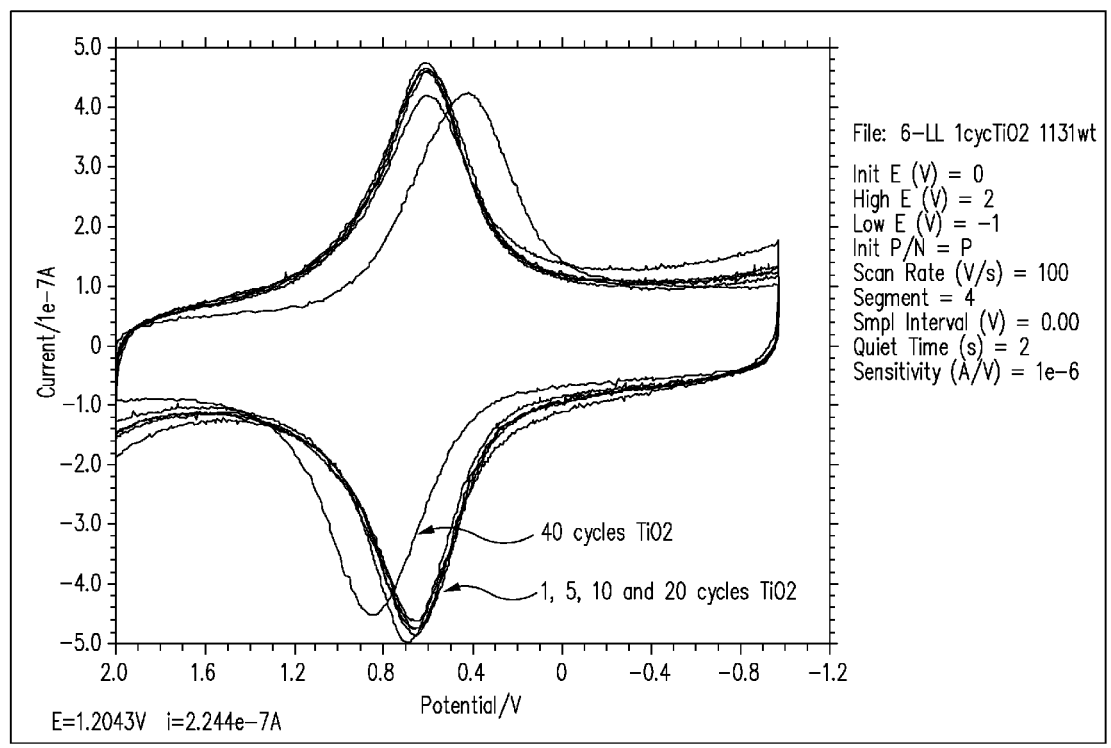
FIGS. 5A and 5B illustrate another current and potential curve illustrating the performance of a molecular memory device according to another embodiment of the present invention.
Figure 5B:
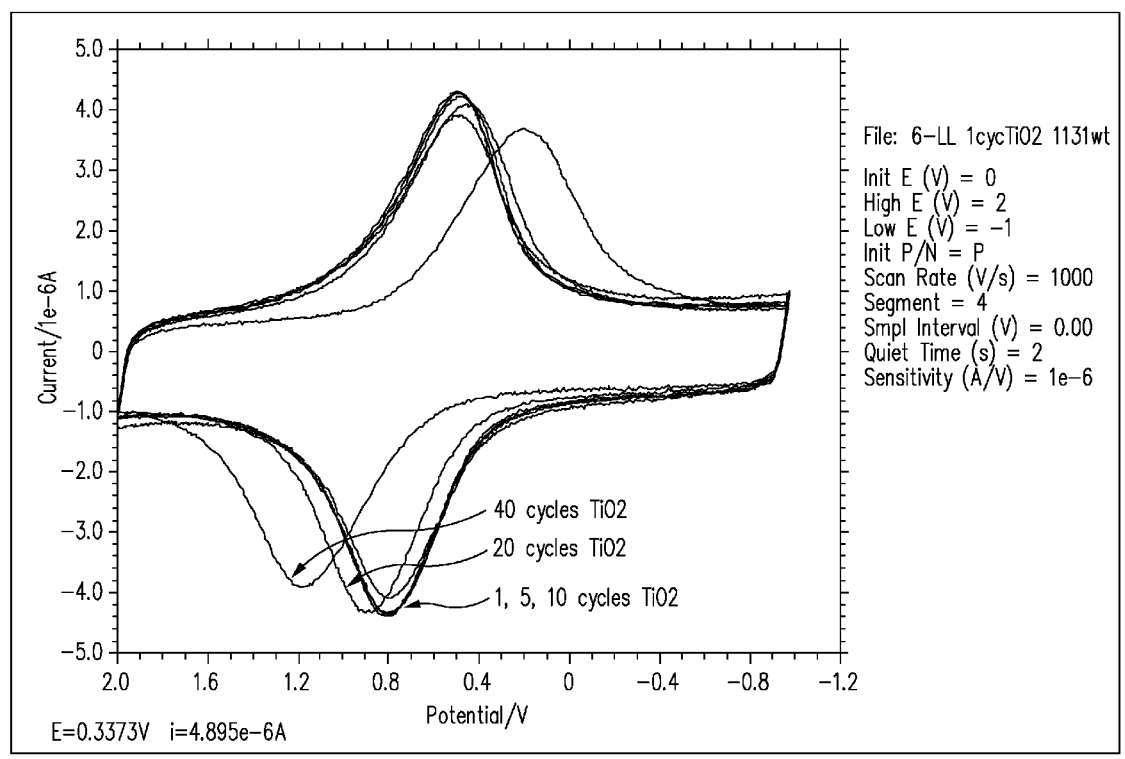

In this example, molecular based devices were formed with a wetting layer comprised of $TiO_2$ deposited below the molecular layer. In the exemplary embodiment, the $TiO_2$ layer was formed after deposition of the redox-active molecular layer. $H_2O$ vapor is flowed in an inert carrier gas at a flowrate in the range of 1 to 50 sccm, for a period of time in the range of $1\times10^{-5}$ to 10 seconds. This first step is carried out at a process pressure in the range of $1\times10^{-5}$ to 1 Torr. The $H_2O$ vapor is then purged from the deposition chamber. Next, tetrakis(dimethylamido) Ti(IV) is flowed into the deposition chamber in an inert carrier gas at a flowrate in the range of 1 to 50 sccm, for a period of time in the range of $1\times10^{-5}$ to 10 seconds. This second step is carried out at a process pressure in the range of $1\times10^{-5}$ to 1 Torr. The deposition chamber is then purged. Following the deposition of the $TiO_2$ wetting layer, the redox-active molecular layer was deposited. FIGS. 5A and 5B depict current and potential curves illustrating the performance of a molecular memory devices formed in this Example 2. As shown, the number of cycles of $TiO_2$ deposited did not impact the amount of charge observed by integration of the peaks in the current potential curve. The speed of the device, as determined by the difference in potential observed between the oxidation peak and the reduction peak, was not impacted until greater than 20 cycles of $TiO_2$ were deposited.

Example 3

Figures 6A, 6B:
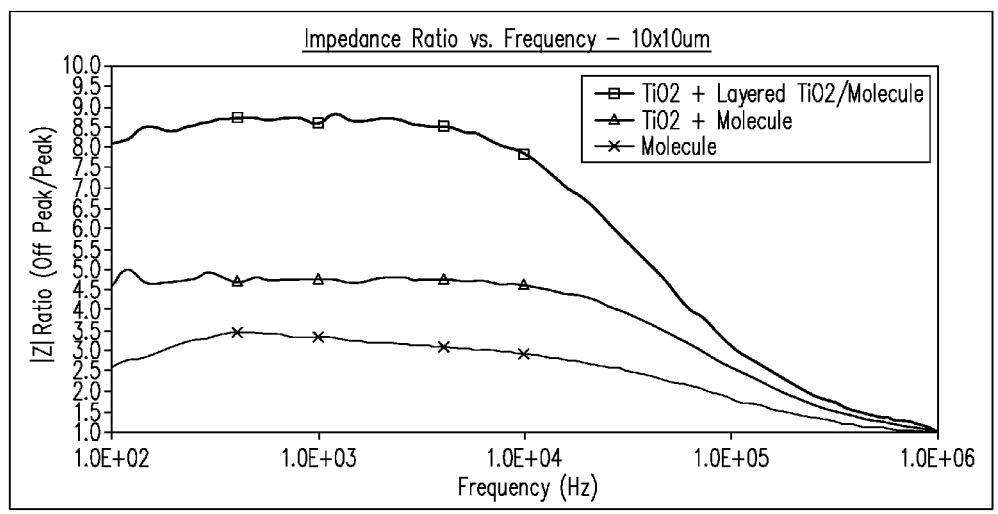
FIGS. 6A and 6B show impedance-frequency response curves (FIG. 6A) for devices according to different embodiments of the present invention and compared to a device without the wetting layer of the present invention, formed according to various process conditions (FIG. 6B).

Impedance ration verses frequency of devices formed according to the present invention were tested as shown in FIGS. 6A and 6B. Three devices were formed by first: depositing 2 cycles of TiO$_2$ layers followed by 20 cycles of TiO$_2$+ redox active molecular layer, using the same process conditions as reported above in Examples 1 and 2. Next, the process was carried out depositing 5 cycles of TiO$_2$ followed by 20 cycles of the redox active molecular layer, and finally 20 cycles of the redox active molecular layer without any TiO$_2$ layer. The speed at which the redox-active molecular layer performs was judged by measuring the impedance of the device at 1) a potential where no redox activity from the molecular layer occurs (Off Peak) and 2) at potential where the redox-active layer is oxidized and reduced (Peak). The ratio of the impedance at these two potentials is indicative of the amount of charge from the redox-active layer (magnitude of the y-axis) and the maximum speed the molecular device can achieve (the point at which the |Z| ratio becomes unity). As evidenced by the magnitude of the |Z| ratio, inclusion of the TiO$_2$ layer, either before deposition of the redox-active molecular layer or interstitially in the redox-active molecular layer, improves the amount of charge measured in the device. Also, the frequency at which the redox-active molecules no longer contribute to the amount of charge observed in the device (where the |Z| ratio is 1) is improved by inclusion of the TiO$_2$ layer, either before deposition of the redox-active molecular layer or interstitially in the redox-active molecular layer.

The present invention is not to be limited in scope by the specific embodiments disclosed in the examples which are intended as illustrations of a few aspects of the invention and any embodiments which are functionally equivalent are within the scope of this invention. Indeed, various modifications of the invention in addition to those shown and described herein will become apparent to those skilled in the art and are intended to fall within the appended claims.

A number of references have been cited, the entire disclosures of which are incorporated herein by reference.

What is claimed is:

1. A molecular device, comprising:
   a substrate;
   a wetting layer atop the substrate;
   a molecular layer atop the wetting layer; and
   a charge transfer layer atop the molecular layer, wherein the substrate is comprised of a silicon wafer having conductive and non-conductive regions or surfaces.

2. The molecular device of claim 1 wherein the conductive surfaces are comprised of any one or more of: titanium, aluminum, copper, tungsten, TiN, and TaN.

3. The molecular device of claim 1 wherein the non-conductive surfaces are comprised of dielectric materials.

4. The molecular device of claim 1 wherein the wetting layer is comprised of a material that promotes nucleation of the molecular layer atop the wetting layer.

5. The molecular device of claim 1 wherein the wetting layer is comprised of a material that promotes equalization of surface tension across substrate.

6. The molecular device of claim 1 wherein the wetting layer is comprised of any one or more of titanium oxides, ruthenium oxides, tantalum oxides, aluminum oxides, hafnium oxides, or inorganic nitrides.

7. The molecular device of claim 1 wherein the wetting layer is comprised of TiO$_2$.

8. The molecular device of claim 1 wherein the thickness of the wetting layer is in the range of about 0.1 to 0.5 nm.

9. The molecular device of claim 1 wherein the thickness of the molecular layer is in the range of about 0.1 to 10.0 nm.

10. The molecular device of claim 1 wherein the thickness of the charge transfer layer is in the range of about 2.0 to 50.0 nm.

11. A molecular device, comprising:
    a substrate
    a wetting layer atop the substrate;
    a molecular layer atop the wetting layer; and
    a charge transfer layer atop the molecular layer, wherein the molecular layer is comprised of redox active molecules.

12. A molecular device, comprising:
    a substrate;
    a wetting layer atop the substrate;
    a molecular layer atop the wetting layer; and
    a charge transfer layer atop the molecular layer, wherein the charge transfer layer is comprised of an electrolyte.

13. The molecular device of claim 12 wherein the charge transfer layer is comprised of a phosphonium based electrolyte.

14. A memory element, comprising:
    a switching device,
    a bit line and a word line coupled to the switching device; and
    a molecular storage device coupled to the switching device, the molecular storage device comprised of:
       a substrate, wherein the substrate is comprised of a silicon wafer having conductive and non-conductive regions or surfaces;
       a wetting layer atop the substrate;
       a molecular layer atop the wetting layer; and
       a charge transfer layer atop the molecular layer.

15. A memory array, comprising:
    an array of memory elements, wherein at least some of the memory elements comprise:
    a switching device,
    a bit line and a word line coupled to the switching device; and
    a molecular storage device coupled to the switching device, the molecular storage device comprised of:
       a substrate, wherein the substrate is comprised of a silicon wafer having conductive and non-conductive regions or surfaces;
       a wetting layer atop the substrate;
       a molecular layer atop the wetting layer; and
       a charge transfer layer atop the molecular layer.

16. A molecular device, comprising:
    a substrate
    a molecular layer atop the substrate wetting layer; and
    a charge transfer layer atop the molecular layer, wherein the molecular layer is comprised of molecules having functional groups configured to promote nucleation of the charge transfer layer atop the molecular layer.

17. The molecular device of claim 16 wherein the functional groups are comprised of OH, NH$_3$, or OCH$_3$.

* * * * *